US009484485B2

(12) United States Patent
Adachi et al.

(10) Patent No.: US 9,484,485 B2
(45) Date of Patent: Nov. 1, 2016

(54) SOLAR CELL, MANUFACTURING METHOD THEREFOR, SOLAR-CELL MODULE, AND MANUFACTURING METHOD THEREFOR

(71) Applicant: KANEKA CORPORATION, Osaka-shi, Osaka (JP)

(72) Inventors: Daisuke Adachi, Settsu (JP); Hisashi Uzu, Settu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/893,494

(22) PCT Filed: May 27, 2014

(86) PCT No.: PCT/JP2014/063962
§ 371 (c)(1),
(2) Date: Nov. 23, 2015

(87) PCT Pub. No.: WO2014/192739
PCT Pub. Date: Dec. 4, 2014

(65) Prior Publication Data
US 2016/0181466 A1    Jun. 23, 2016

(30) Foreign Application Priority Data

May 29, 2013   (JP) ................................. 2013-113524

(51) Int. Cl.
*H01L 21/00*   (2006.01)
*H01L 31/18*   (2006.01)
(Continued)

(52) U.S. Cl.
CPC ..... *H01L 31/1884* (2013.01); *H01L 31/02168* (2013.01); *H01L 31/022425* (2013.01);
(Continued)

(58) Field of Classification Search
CPC .................. H01L 31/022425; H01L 31/0747;
H01L 31/202; H01L 31/022466; H01L 31/035281; H01L 31/022433; H01L 31/035245; H01L 31/03682; H01L 31/03762; H01L 31/048; H01L 31/068; H01L 31/075; H01L 31/18; H01L 31/1804; H01L 31/1884; H01L 31/20
See application file for complete search history.

(56) References Cited

U.S. PATENT DOCUMENTS 4,586,988 A    5/1986   Nath et al.
5,935,344 A *  8/1999   Endo ..................... H01L 31/202
                                                        136/255
(Continued)

FOREIGN PATENT DOCUMENTS

JP    S6066426 A      4/1985
JP    H09129904 A     5/1997
(Continued)

OTHER PUBLICATIONS

ISA Japanese Patent Office, International Search Report Issued in Application No. PCT/JP2014/063962, Jun. 24, 2014, WIPO, 4 pages.

*Primary Examiner* — Chuong A Luu
*Assistant Examiner* — Cory Eskridge
(74) *Attorney, Agent, or Firm* — Alleman Hall McCoy Russell & Tuttle LLP

(57) ABSTRACT

Provided is a solar cell including a photoelectric conversion section having a first principal surface and a second principal surface, and a collecting electrode formed on the first principal surface of photoelectric conversion section. The photoelectric conversion section includes a semiconductor-stacked portion including a semiconductor junction, a first electrode layer which is a transparent electrode layer formed on the first principal surface side of the semiconductor-stacked portion, and a second electrode layer formed on the second principal surface side of the semiconductor-stacked portion. The collecting electrode includes a first electroconductive layer and a second electroconductive layer. In the manufacturing method, an insulating layer is formed on the first electrode layer, and the electrode layer exposed to the surface of the insulating layer-non-formed region is removed to eliminate a short circuit between the first and second electrode layers. The second electroconductive layer is formed by plating.

18 Claims, 10 Drawing Sheets

(51) Int. Cl.
  *H01L 31/0747* (2012.01)
  *H01L 31/0216* (2014.01)
  *H01L 31/0224* (2006.01)
  *H01L 31/048* (2014.01)

(52) U.S. Cl.
  CPC ..... *H01L31/022466* (2013.01); *H01L 31/048* (2013.01); *H01L 31/0747* (2013.01); *H01L 31/1804* (2013.01); *Y02E 10/547* (2013.01); *Y02P 70/521* (2015.11)

(56) References Cited

U.S. PATENT DOCUMENTS

2006/0219292 A1  10/2006  Asaumi et al.
2012/0125397 A1   5/2012  Okada et al.
2012/0291844 A1  11/2012  Tsuge

FOREIGN PATENT DOCUMENTS

| | | |
|---|---|---|
| JP | 2000058885 A | 2/2000 |
| JP | 2000058888 A | 2/2000 |
| JP | 2001044461 A | 2/2001 |
| JP | 2006310774 A | 11/2006 |
| JP | 2010010493 A | 1/2010 |
| JP | 2010177444 A | 8/2010 |
| JP | 2011199045 A | 10/2011 |
| WO | 2011040489 A1 | 4/2011 |
| WO | 2011045287 A1 | 4/2011 |

\* cited by examiner

FIG. 10(A)
FIG. 10(B)
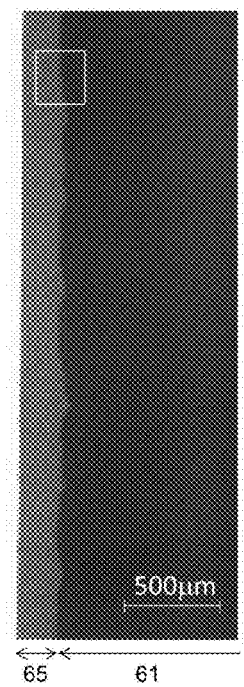
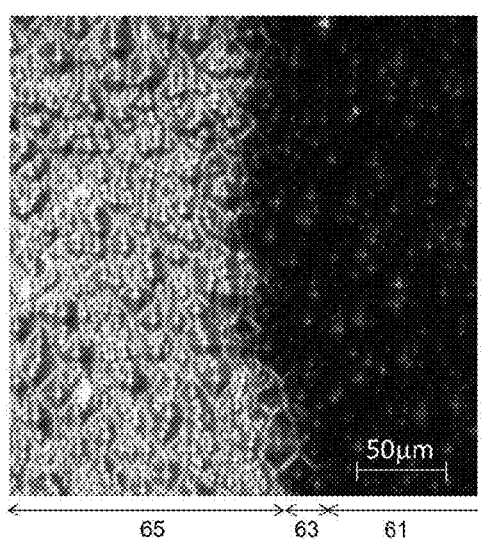
FIG. 11
PRIOR ART
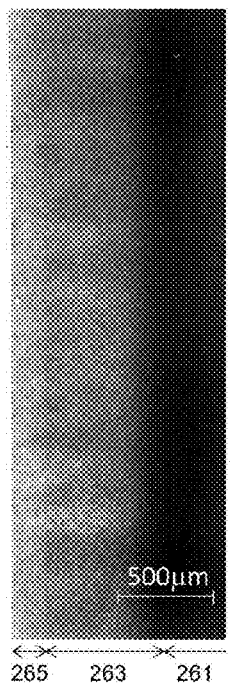

SOLAR CELL, MANUFACTURING METHOD THEREFOR, SOLAR-CELL MODULE, AND MANUFACTURING METHOD THEREFOR

TECHNICAL FIELD

The present invention relates to a solar cell and a manufacturing method therefor. The present invention also relates to a solar cell module and a manufacturing method therefor.

BACKGROUND ART

Since energy issues and global environmental issues are becoming more serious, solar cells are receiving more attention as an alternative energy for replacing fossil fuels. In the solar cell, carriers (electrons and holes) generated by light irradiation to a photoelectric conversion section composed of a semiconductor junction or the like are extracted to an external circuit to generate electricity. A collecting electrode is provided on the photoelectric conversion section of the solar cell for efficiently extracting carriers generated at the photoelectric conversion section to the external circuit.

For example, in a crystalline silicon-based solar cell using a single crystal silicon substrate or a polycrystalline silicon substrate, a collecting electrode made of fine metal is provided on a light-receiving surface. Also, in a heterojunction solar cell having amorphous silicon layers and transparent electrode layers on a crystalline silicon substrate, collecting electrode(s) are provided on the transparent electrode layer(s).

The collecting electrode of the solar cell is generally formed by pattern-printing a silver paste by a screen printing method. This method is simple in terms of the process itself, but has such a problem that the material cost of silver is high, and the resistivity of the collecting electrode increases when a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading loss by the collecting electrode increases.

For solving these problems, a method is known in which a collecting electrode is formed by a plating method excellent in terms of material cost and process cost. For example, Patent Documents 1 and 2 disclose a solar cell in which a metal layer made of copper or the like is formed by a plating method on a transparent electrode that forms a photoelectric conversion section. In this method, first, a resist material layer (insulating layer) having an opening corresponding to the shape of a collecting electrode is formed on the transparent electrode layer of the photoelectric conversion section, and a metal layer is formed at the resist opening section of the transparent electrode layer by electroplating. Thereafter, the resist is removed to form a collecting electrode having a predetermined shape.

Patent Document 3 discloses a method in which an insulating layer of $SiO_2$ or the like is provided on a transparent electrode, a groove extending through the insulating layer is then provided to expose the surface or side surface of the transparent electrode layer, and a metal collecting electrode is formed so as to be in conduction with an exposed area of the transparent electrode. Specifically, a method is proposed in which a metal seed is formed on the exposed area of the transparent electrode layer by a light induced plating method or the like, and a metal electrode is formed by electroplating with the metal seed as an origination point. In this method, the contact resistance between a transparent electrode layer and a collecting electrode can be lowered by providing a low-resistance metal seed.

Patent Document 4 discloses a method in which an electroconductive seed having a coarse roughness is formed on a transparent electrode layer and an insulating layer is deposited thereon. According to this method, the whole surface of a transparent electrode layer other than the electroconductive seed-formation part of the photoelectric conversion section is covered with the insulating layer, and discontinuous openings are formed in the insulating layer on the electroconductive seed. A metal layer is formed by plating through the openings in the insulating layer.

In formation of a photoelectric conversion section of a solar cell, thin-films such as a semiconductor layer, a transparent electrode layer, and a metal electrode layer are generally formed on the surface of a substrate by a plasma-enhanced chemical vapor deposition (CVD) method, a sputtering method or the like. These thin-films exist not only on the front surface of a substrate, but also on the side surface and on the back surface since the deposited films wrap around thereon, and thereby cause a short circuit and leakage between the front surface and the back surface. For preventing the above-described wraparound, for example, a method is proposed in Patent Document 5 in which semiconductor layers and electrode layers are formed while the periphery of a crystalline silicon substrate is covered with a deposition mask.

Patent Documents 6 and 7 disclose methods for removing the short circuit of the electrodes between the front surface and the back surface by performing predetermined processing after forming a semiconductor thin-film and an electrode on a substrate. Specifically, Patent Document 6 proposes a method in which a semiconductor thin-film and a transparent electrode layer formed on a crystalline silicon substrate are removed by laser irradiation to form a groove. In Patent Document 7, a method is disclosed in which a groove is formed by laser irradiation, and thereafter a crystalline silicon substrate is cleaved along the groove to form a solar cell in which the side surface of a photoelectric conversion section is composed of a cut surface. Either a semiconductor thin-film or an electrode layer is not present on the surface of the groove in Patent Document 6 and the cut surface in Patent Document 7, and therefore the problem of a short circuit resulting from wraparound is solved.

PRIOR ART DOCUMENTS

Patent Documents

Patent Document 1: JP-60-66426
Patent Document 2: JP-A 2000-58885
Patent Document 3: JP-A 2011-199045
Patent Document 4: WO2011/045287
Patent Document 5: JP-A 2001-44461
Patent Document 6: JP-9-129904
Patent Document 7: JP-A 2006-310774

SUMMARY OF THE INVENTION

Problems to be Solved by the Invention

As described in Patent Documents 1 to 4 and the like, formation of a collecting electrode by a plating method is excellent in terms of material cost and process cost. On the other hand, in Patent Documents 1 to 4, a short circuit between the front surface and the back surface, which may occur due to wraparound during deposition of electroconductive thin-films, is not discussed (in Patent Document 3, a short circuit between the front and the back surfaces is temporarily eliminated by formation of a groove, but when a metal seed and a metal electrode are formed, the short circuit occurs again). When a crystalline silicon substrate is cleaved along a groove formed by application of laser light for eliminating a short circuit between the front and the back surfaces, as disclosed in Patent Document 6, there is a problem that since laser light is applied to a PN reverse-junction section of a semiconductor, a leakage current is generated due to reduction of resistance of a laser light-applied section, or the like, so that solar cell characteristics are deteriorated. The method in which a substrate is cleaved as disclosed in Patent Document 7 has a problem in terms of productivity.

When an electrode layer is formed using a mask so as not to cause a short circuit between electrodes on the front and the back surfaces as disclosed in Patent Document 5, deposition is performed while the surface of a silicon thin-film is covered with a deposition mask made of a metal, etc. When deposition is performed while a metal mask is in contact with the silicon thin-film, performance of the solar cell tends to be deteriorated due to damage to the silicon thin-film by heating, plasma power and the like, or diffusion of metal components to the silicon thin-film and the crystalline silicon substrate. Further, at the time of placing the mask at a predetermined position on the silicon thin-film, or removing the mask after deposition, physical damage such as very small scratches may occur on the surface of the silicon thin-film. This is also a factor of deterioration of solar cell performance.

On the other hand, when deposition is performed with the deposition mask and the silicon thin-film kept from coming into contact with each other by providing a gap between the deposition mask and the silicon thin-film, defects resulting from contact between the metal mask and the silicon thin-film as described above can be inhibited. However, the transparent electrode layer is formed so as to penetrate into a gap portion between the mask and the silicon thin-film (immediately below a mask shielding region), and therefore it is necessary to enlarge the mask shielding region for reliably preventing a short circuit between the front surface and the back surface.

In a region where the electroconductive thin-film is formed so as to penetrate into a gap portion between the mask and the silicon-based thin-film, the coverage and the thickness of the electroconductive thin-film tend to decrease as compared to other regions (regions which are not shielded with a mask and have a constant thickness) (hereinafter, the region where at least one of the thickness and the coverage is smaller as compared to other regions may be referred to as a "transition region"). When the width of such a transparent electrode layer-transition region increases, solar cell performance tends to be deteriorated due to an increase in resistance of the transparent electrode layer and reflectance associated with multiple interference at the interface. The transparent electrode layer-transition region is also formed at the mask shielding region, and therefore a short circuit with the electrode layer easily occurs on the back side.

As described above, formation of a collecting electrode by a plating method is excellent in terms of material cost and process cost. However, an effective method capable of achieving both formation of a collecting electrode by a plating method and elimination (avoidance) of a short circuit between the front and the back surfaces, which can occur due to wraparound during deposition of electroconductive thin-films such as transparent electrode layers, has not been found yet.

An object of the present invention is solving the above-described problems to provide a solar cell with high conversion efficiency in which a collecting electrode is formed by a plating method capable of reducing material cost and process cost, and a short circuit between electrodes on the front and the back surfaces is eliminated.

Means for Solving the Problem

As a result of conducting vigorous studies in view of the above-mentioned problems, the inventors herein have found that when a short circuit between the front and the back surfaces is eliminated by etching an electrode layer on an outer peripheral portion on the light incident side, formation of a collecting electrode by a plating method and elimination of the short circuit between the front and the back surfaces can be achieved with a small number of steps, so that a solar cell with high conversion efficiency can be manufactured at a low cost, leading to the present invention.

The present invention relates to a solar cell having a collecting electrode on a photoelectric conversion section, a manufacturing method thereof, and a solar cell module. The photoelectric conversion section includes a semiconductor-stacked portion including a semiconductor junction, a first electrode layer formed on the first principal surface side of the semiconductor-stacked portion, and a second electrode layer formed on the second principal surface side of the semiconductor-stacked portion.

The first electrode layer is a transparent electrode layer and the collecting electrode includes a first electroconductive layer and a second electroconductive layer in this order from the first principal surface side of the photoelectric conversion section. The solar cell of the present invention includes on the first principal surface of the photoelectric conversion section an electrode layer-non-formed region on which either the first electrode layer or the second electrode layer is not formed.

In one embodiment, the semiconductor-stacked portion of the photoelectric conversion section includes a silicon-based thin-film on a first principal surface of a crystalline silicon substrate, and includes a silicon-based thin-film of a conductivity-type different from the conductivity-type in the silicon-based thin-film on the first principal surface, on a second principal surface of the crystalline silicon substrate of a first conductivity-type.

The solar cell of the present invention includes a step of forming the first electrode layer and the second electrode layer, respectively, on the first principal surface and the second principal surface on the semiconductor-stacked portion (photoelectric conversion section providing step), a step of forming the first electroconductive layer on the first electrode layer (first electroconductive layer forming step), a step of forming an insulating layer on the first electrode layer (insulating layer forming step), and a step of forming the second electroconductive layer on the first electroconductive layer by a plating method (second electroconductive layer forming step). As the second electroconductive layer, a metal layer including copper as a main component, for example, is formed by a plating method. The insulating layer on the first electrode layer is a layer for protecting the photoelectric conversion section against a plating solution in formation of the second electroconductive layer by plating.

In the photoelectric conversion section providing step, the first electrode layer and the second electrode layer are formed without using a mask. Therefore, a state is created in which the first electrode layer and the second electrode layer are short-circuited. In the insulating layer forming step, an insulating layer is not formed on the outer peripheral portion of the first principal surface. Therefore, the first electrode layer or the second electrode layer exposes to the surface in the insulating layer-non-formed region on the outer peripheral portion of the first principal surface. Thereafter, in the insulating layer forming step, the electrode layer exposed to the surface of the insulating layer-non-formed region is removed (short circuit eliminating step). The short circuit between the first electrode layer and the second electrode layer is eliminated through the short circuit eliminating step.

Elimination of a short circuit is performed preferably by a wet method. The electrode layers exposed to the surface of the insulating layer-non-formed region may be removed by the same kind of chemical solution as the plating solution used for formation of the second electroconductive layer. In a plating apparatus for forming the second electroconductive layer, the electrode layers exposed to the surface of the insulating layer-non-formed region may be removed by the plating solution used for formation of the second electroconductive layer.

The solar cell of the present invention includes a region having no transparent electrode layer (transparent electrode layer-non-formed region) in the vicinity of the outer periphery of the first principal surface of the photoelectric conversion section, because the electrode layers exposed to the surface of the insulating layer-non-formed region are removed in the manufacturing process of the solar cell. The transparent electrode layer-non-formed region is preferably a region of 5.0 mm or less from the outer periphery of the first principal surface. A first electrode layer-transition region where at least one of the coverage and the thickness of the first electrode layer is smaller as compared to other first electrode layer-formed regions may be formed on the outer peripheral portion of the first electrode layer. The width of the first electrode layer-transition region is preferably 0.001 mm or more and 0.5 mm or less.

The insulating layer can act as a layer for selectively forming the second electroconductive layer on the first electroconductive layer, in addition to acting as a layer for protecting the photoelectric conversion section against the plating solution. Therefore, in one embodiment of the present invention, an insulating layer is not formed on the first electroconductive layer in the insulating layer forming step.

In the insulating layer forming step, the second electroconductive layer can also be selectively formed on the first electroconductive layer by forming an opening in the insulating layer on the first electroconductive layer after the insulating layer is formed on the first electroconductive layer as well. In this case, in the second electroconductive layer forming step, the second electroconductive layer in conduction with the first electroconductive layer is formed by a plating method through the opening provided in the insulating layer on the first electroconductive layer. For example, when the first electroconductive layer contains a low-melting-point material, and a heating treatment is performed at an annealing temperature Ta higher than the thermal-fluidization onset temperature $T_1$ of the low-melting-point material after the insulating layer forming step and before the second electroconductive layer forming step, an opening can be formed in the insulating layer.

Effects of the Invention

According to the manufacturing method of the present invention, an electrode layer exposed to the surface of the insulating layer-non-formed region is removed to eliminate a short circuit between electrode layers on the front and the back surfaces, and therefore the effective power generation area of a solar cell can be made larger as compared to a case where a transparent electrode layer is formed using a mask, and a case where the outer peripheral portion of a photoelectric conversion section is cleaved and removed using a laser, etc. An insulating layer 9 acts as a protecting layer in the removal of an electrode on the outer peripheral portion, and also acts as a protecting layer for the transparent electrode layer in formation of a second electroconductive layer by plating. Therefore, according to the manufacturing method of the present invention, a solar cell having high efficiency can be provided inexpensively.

BRIEF DESCRIPTION OF THE DRAWINGS

FIGS. 10(A) and (B) are microscopic observation images of an outer peripheral portion of the solar cell formed in Preparation Example 4 (the present invention).

FIG. 11 is a microscopic observation image of an outer peripheral portion of the solar cell formed in Preparation Example 6 (related art).

DESCRIPTION OF EMBODIMENTS

The present invention will be described more in detail below taking as an example a heterojunction crystalline silicon solar cell (hereinafter, referred to as a "heterojunction solar cell" in some cases) as one embodiment of the present invention. The heterojunction solar cell is a crystalline silicon-based solar cell in which a silicon-based thin-film having a band gap different from that of a single crystal silicon is formed on a surface of a single crystalline silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is one configuration of crystalline silicon solar cell with high conversion efficiency.

Figure 1:
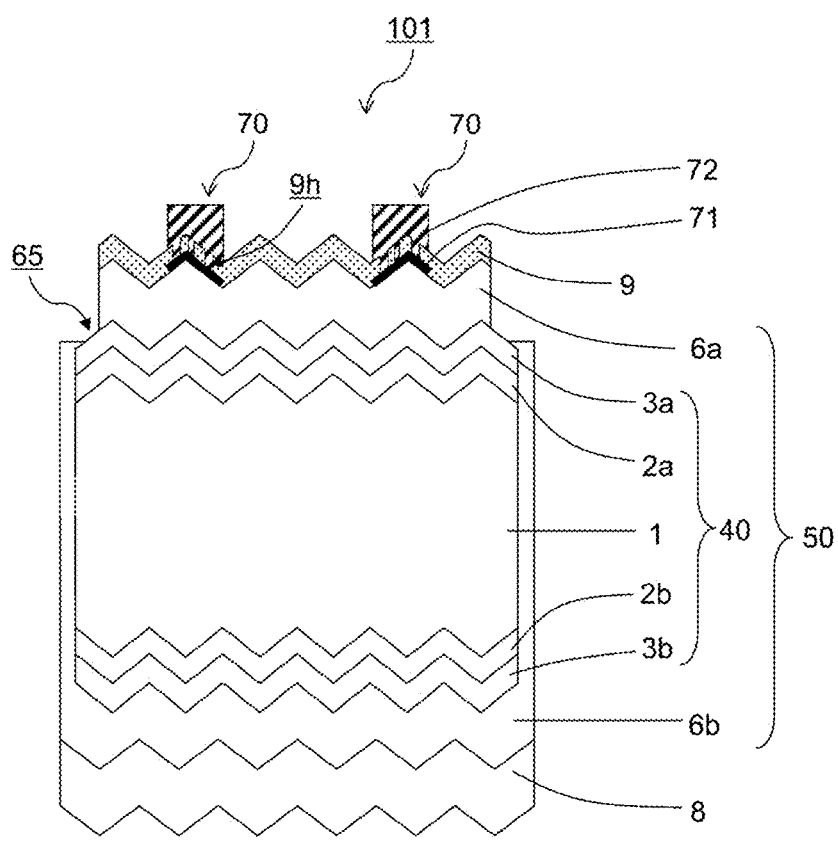
FIG. 1 is a schematic sectional view showing a heterojunction solar cell according to one embodiment.

FIG. 1 is a schematic sectional view of a heterojunction solar cell according to one embodiment of the present invention. The heterojunction solar cell 101 includes, as a photoelectric conversion section 50, a conductive silicon-based thin-film 3a, and a light-receiving side transparent electrode layer 6a as a first electrode layer in this order on a first principal surface (light-receiving surface) of a crystal silicon substrate 1; and a conductive silicon-based thin-film 3b and a back side transparent electrode layer 6b as a second electrode layer in this order on a second principal surface (back surface) of the crystal silicon substrate 1. Specifically, the photoelectric conversion section includes a semiconductor-stacked portion 40 including a semiconductor junction composed of the crystalline silicon substrate 1 and the conductive silicon-based thin-films 3a and 3b, and further includes the electrodes 6a and 6b on the first principal surface and the second principal surface, respectively, of the semiconductor-stacked portion 40. The semiconductor-stacked portion of the heterojunction solar cell preferably includes intrinsic silicon-based thin-films 2a and 2b arranged between the crystal silicon substrate 1 and the conductive silicon-based thin-films 3a and 3b, respectively. The second electrode layer provided on the back side of the photoelectric conversion section may include a back side metal electrode 8 on the back side transparent electrode layer 6b.

The light-receiving side transparent electrode layer 6a is an outermost layer on the first principal surface side of the photoelectric conversion section 50. On the light-receiving side transparent electrode layer 6a, a collecting electrode 70 is provided. The collecting electrode 70 in the solar cell of the present invention includes a first electroconductive layer 71 and a second electroconductive layer 72 from the light-receiving side transparent electrode layer 6a side. The solar cell of the present invention includes an electrode layer-non-formed region 65 on the outer peripheral portion of the light-receiving side.

[Configuration of Photoelectric Conversion Section]

First, the crystalline silicon substrate 1 will be described. A single crystal silicon substrate of a first conductivity type is used in the heterojunction solar cell. A crystalline silicon substrate used in a solar cell contains impurities that supply charges to silicon for imparting conductivity, and is classified as an n-type which contains atoms for introducing electrons into silicon atoms (e.g., phosphorus) or a p-type which contains atoms for introducing holes into silicon atoms (e.g., boron). That is, the "first conductivity type" means one of the n-type or the p-type.

In a heterojunction solar cell, electron/hole pairs can be efficiently separated and collected by setting a reverse junction as a heterojunction on the incident side at which light incident to the single crystal silicon substrate is absorbed most, thereby providing a strong electric field. Therefore, the heterojunction on the light-receiving side is preferably a reverse junction. When holes and electrons are compared, electrons, which are smaller in effective mass and scattering cross section, generally have greater mobility. Accordingly, it is preferred that the single crystalline silicon substrate 1 used for a heterojunction solar cell is an n-type single crystal silicon substrate. In order to enhance light confinement, the crystalline silicon substrate 1 preferably has a textured structure in its surface.

Silicon-based thin-films are formed on the surface of the crystal silicon substrate 1 on which a textured structure is formed. The method for forming these silicon-based thin-films is preferably a plasma-enhanced CVD method. Conditions used for forming the silicon-based thin-films by the plasma-enhanced CVD method are preferably as follows: a substrate temperature of 100 to 300° C., a pressure of 20 to 2600 Pa, and a high-frequency power density of 0.004 to 0.8 W/cm$^2$. A source gas used to form the silicon-based thin-film layers may be a silicon-containing gas such as $SiH_4$ or $Si_2H_6$, or a mixed gas of silicon containing gas and $H_2$.

Conductive silicon-based thin-films 3a and 3b are silicon-based thin-films of the first conductivity type and an opposite conductivity type, respectively. For example, when the single crystal silicon substrate of the first conductivity type is an n-type single crystal silicon substrate, the silicon-based thin-film of the first conductivity type and the silicon-based thin-film of the opposite conductivity type are n-type and p-type, respectively. A dopant gas used for forming the p-type or the n-type silicon-based thin-film is preferably, for example, $B_2H_6$ or $PH_3$. The amount of impurity such as P or B added is sufficient as a trace amount; thus, it is preferred to use a mixed gas diluted with $SiH_4$ or $H_2$. When a gas containing a different element, such as $CH_4$, $CO_2$, $NH_3$, or $GeH_4$, is added in deposition of the conductive silicon-based thin-film, silicon is alloyed so that the energy gap of the silicon-based thin-film can be changed.

Examples of the silicon-based thin-film include an amorphous silicon thin-film and microcrystalline silicon (a thin-film including amorphous silicon and crystalline silicon). Among them, an amorphous silicon-based thin-film is preferably used. When an n-type single crystal silicon substrate is used as the single crystal silicon substrate 1 of the first conductivity type, examples of the preferred structure of the photoelectric conversion section 50 include a stacked structure in the order of the light-receiving side transparent electrode layer 6a/the p-type amorphous silicon-based thin-film 3a/the i-type amorphous silicon-based thin-film 2a/the n-type single crystal silicon substrate 1/the i-type amorphous silicon-based thin-film 2b/n-type amorphous silicon-based thin-film 3b/the back side transparent electrode layer 6b. In this case, for the aforementioned reason, the light-receiving side is preferably on the p layer side.

The intrinsic silicon-based thin-films 2a and 2b are preferably i-type hydrogenated amorphous silicon composed of silicon and hydrogen. When i-type hydrogenated amorphous silicon is formed on a crystal silicon substrate by a CVD method, surface passivation can be effectively performed while suppressing diffusion of impurities to the single crystal silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that the optical loss can be reduced.

The photoelectric conversion section 50 of the heterojunction solar cell 101 includes transparent electrode layers 6a and 6b on the conductive silicon-based thin-films 3a and 3b, respectively. The transparent electrode layer is formed by a transparent electrode layer forming step. The transparent electrode layers 6a and 6b have a conductive oxide as a main component. As the conductive oxide, for example, zinc oxide, indium oxide, and tin oxide may be used alone or in mixtures thereof. From the viewpoints of electroconductivity, optical characteristics and long-term reliability, indium-based oxides including indium oxide are preferable. Among them, those having indium tin oxide (ITO) as a main component are more suitably used. The transparent electrode layer may be a single layer or a layered structure composed of multiple layers.

Here, the wording having a specific material "as a main component" in this specification means that the content is more than 50% by weight, preferably 70% by weight or more, more preferably 90% by weight or more.

A dopant can be added to the transparent electrode layer. For example, when zinc oxide is used for the transparent electrode layer, examples of the dopant include aluminum, gallium, boron, silicon, and carbon. When indium oxide is used for the transparent electrode layer, examples of the dopant include zinc, tin, titanium, tungsten, molybdenum, and silicon. When tin oxide is used for the transparent electrode layer, examples of the dopant include fluorine.

The dopant can be added to one or both of the light-receiving side transparent electrode layer 6a and the back side transparent electrode layer 6b. In particular, the dopant is preferably added to the light-receiving side transparent electrode layer 6a. By adding the dopant to the light-receiving side transparent electrode layer 6a, the transparent electrode layer itself is made less resistive, and ohmic loss between the transparent electrode layer 6a and the collecting electrode 70 can be suppressed.

The thickness of the light-receiving side transparent electrode layer 6a is preferably set to 10 nm or more and 140 nm or less, from the viewpoints of transparency, electroconductivity, and reduction of light reflection. The role of the transparent electrode layer 6 is to transport carriers to the collecting electrode, and it suffices that the transparent electrode layer 6 has a level of electroconductivity required for this purpose, and the thickness is preferably 10 nm or more. By ensuring that the thickness is 140 nm or less, the absorption loss at the transparent electrode layer 6 is kept low, so that a reduction in photoelectric conversion efficiency associated with a reduction in transmittance can be suppressed. When the thickness of the light-receiving side transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited, but a physical vapor deposition method such as a sputtering method, a chemical vapor deposition method utilizing a reaction of an organic metal compound with oxygen or water (MOCVD), or the like is preferable. In any of the formation methods, energy from heat or plasma discharge may be utilized.

The substrate temperature during the formation of the transparent electrode layer may be appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond to a silicon atom can be suppressed, and as a result, conversion efficiency can be improved.

A back side metal electrode 8 is preferably formed on the back side transparent electrode layer 6b. For the back side metal electrode 8, it is desirable to use a material having a high reflectivity in a near-infrared to infrared range, and having high electroconductivity and chemical stability. Examples of materials satisfying these characteristics include silver and aluminum. The method for forming a back side metal electrode is not particularly limited, and a physical vapor deposition method such as a sputtering method or a vacuum vapor deposition method, a printing method such as screen printing, or the like is applicable.

[Electrode Layer-non-Formed Region]

Figure 2:
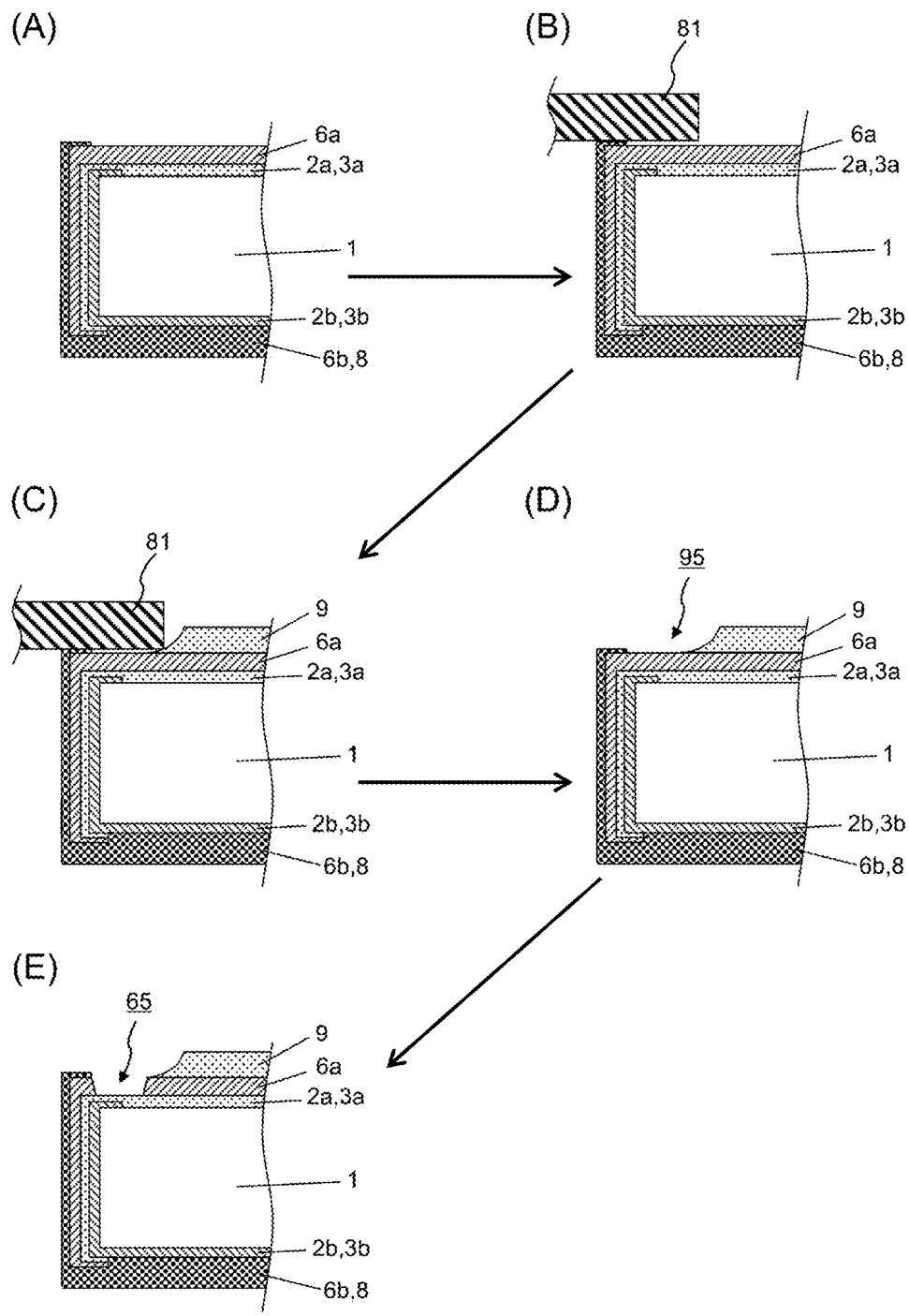
FIG. 2 is a conceptual flow chart showing a production process for a solar cell according to one embodiment of the present invention.

FIG. 2 is a conceptual flow chart showing one mode of forming an electrode layer-non-formed region on light-receiving side of a photoelectric conversion section. FIG. 2 at (A) is a sectional view schematically showing a state in a vicinity of an outer peripheral portion of a crystalline silicon substrate, in which silicon-based thin-films 2a and 3a and a transparent electrode layer 6a; and silicon-based thin-films 2b and 3b, a back side transparent electrode layer 6b and a back side metal electrode 8 are formed on the crystalline silicon substrate 1. FIG. 2 at (A) schematically shows a structure when an intrinsic silicon-based thin-film 2b and a silicon-based thin-film 3b of a first conductivity-type are formed on the back side of the crystalline silicon substrate 1, an intrinsic silicon-based thin-film 2a and a silicon-based thin-film 3a of an opposite conductivity-type are thereafter formed on the light-receiving side, and thereafter a light-receiving side transparent electrode layer 6a and a back side transparent electrode layer 6b and a back side metal electrode 8 are formed (the order of formation of the layers of the crystalline silicon-based solar cell is not limited to the configuration shown in FIG. 2).

When the layers are formed by a CVD method, a sputtering method, or the like without using a deposition mask, the intrinsic silicon-based thin-film 2b, the silicon-based thin-film 3b of the first conductivity-type, the back side transparent electrode layer 6b, and the back side metal electrode 8 on the back side of the crystalline silicon substrate 1 extend to the side surface and the light-receiving surface of the crystalline silicon substrate 1 due to wraparound during deposition. The intrinsic silicon-based thin-film 2a, the silicon-based thin-film 3a of the opposite conductivity-type, and the light-receiving side transparent electrode layer 6a, which are formed on the light-receiving surface of the crystalline silicon substrate 1, extend to the side surface and the back side of the crystalline silicon substrate 1 due to wraparound during deposition.

When such wraparound occurs, the characteristics of the solar cell may be deteriorated as the electrode layer on the light-receiving side and the electrode layer(s) on the back side are short circuited as is understood from FIG. 2 at (A). It is necessary to eliminate such a short circuit between electrodes on the front and the back surfaces for preparing a solar cell excellent in conversion characteristics. In the present invention, as shown in FIG. 2 at (B) to (E), the insulating layer 9 is formed on the transparent electrode layer 6a, and the electrode layer exposed to the surface of the insulating layer-non-formed region is then removed to form an electrode layer-non-formed region 65, so that a short circuit between the electrode layer on the front side (light-receiving side transparent electrode layer 6a) and the electrode layer(s) on the back side (back side transparent electrode layer 6b and back side metal electrode 8) is eliminated.

As shown in FIG. 2 at (D), an insulating layer-non-formed region 95, which is not provided with the insulating layer 9, exists on the outer peripheral portion of the first principal surface of the photoelectric conversion section. For example, when the outer peripheral portion of the light-receiving side transparent electrode layer 6a is covered with a mask 81 (FIG. 2 at (B)), and the insulating layer 9 is formed by a dry method such as a CVD method or a sputtering method, a region of the outer peripheral portion, which is covered with the mask 81, is made to be the insulating layer-non-formed region 95. In this specification, the "outer peripheral portion" of the photoelectric conversion section is set within a range of 5 mm or less from the outer periphery of the photoelectric conversion section.

(Insulating Layer)

For the insulating layer 9, a material that is electrically insulating is used. The insulating layer 9 acts as an etching resist at the time when the transparent electrode layer exposed to the insulating layer-non-formed region is removed by etching to form an electrode layer-non-formed region (see FIG. 2 at (E)). Therefore, for the insulating layer 9, a material having chemical stability to an etchant to be used for removing the transparent electrode layer 6a by etching is used. As described in detail later, the insulating layer 9 also acts as a protecting layer for protecting the transparent electrode layer against the plating solution during formation of the second electroconductive layer of the collecting electrode. Therefore, it is desirable that the insulating layer be made of a material having chemical stability to the plating solution. Generally, the etchant and the plating solution for the transparent electrode layer (metal oxide) are both acidic, and therefore it is preferred that the insulating layer 9 is made of a material having acid resistance.

The insulating layer 9 preferably has high adhesive strength with the light-receiving side transparent electrode layer 6a on the surface of the photoelectric conversion section. By increasing the adhesive strength between the transparent electrode layer and the insulating layer, undesired etching at the vicinity of the interface is inhibited during the etching for removing the transparent electrode layer 6a exposed to the surface of the insulating layer-non-formed region 95. In addition, when the adhesive strength between the transparent electrode layer and the insulating layer is high, the insulating layer hardly peels off during the plating for forming the second electroconductive layer, so that the undesired deposition of a metal onto the transparent electrode layer can be prevented.

For the insulating layer 9, a material having a low optical absorption is preferably used. The insulating layer 9 is formed on the light-receiving side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer. When a solar cell is provided for a practical use without removing the insulating layer 9, it is desirable that a material having sufficient weather resistance and stability to heat/humidity in addition to transparency is used for forming the insulating layer 9.

The material of the insulating layer may be an inorganic insulating material or an organic insulating material, as long as the material satisfies the aforementioned demand characteristics. As the organic insulating material, a material such as polyester, ethylene-vinyl acetate copolymer, acrylic, epoxy, or polyurethane can be used. A resist material having acid resistance may also be used.

From the viewpoints of resistance to an etchant and a plating solution and transparency, it is preferred to use an inorganic material as the insulating material. As the inorganic insulating material, a material such as silicon oxide, silicon nitride, titanium oxide, aluminum oxide, magnesium oxide, or zinc oxide can be used. Among the insulating inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate, or the like is suitably used. From the viewpoints of electrical properties, adhesion to the transparent electrode layer and the like, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, or the like is suitably used. Above all, silicon oxide, silicon nitride, or the like is especially suitably used to adjust the refractive index appropriately. These inorganic materials are not limited to those having a stoichiometric composition, but may be those having oxygen-deficiencies.

The thickness of the insulating layer 9 may be set appropriately, according to the material of the insulating layer and method of formation thereof. By appropriately setting the optical characteristics and thickness of the insulating layer 9, light reflection characteristics are improved, and the amount of light introduced into the solar cell is increased, so that conversion efficiency can be further improved. For obtaining this effect, the refractive index of the insulating layer 9 is preferably lower than the refractive index of the surface of the photoelectric conversion section 50. In order to impart suitable antireflection characteristics to the insulating layer 9, the thickness is preferably set within a range of 30 nm to 250 nm, and more preferably set within a range of 50 nm to 250 nm.

The insulating layer can be formed using a known method. For example, a dry process such as a plasma-enhanced CVD method or a sputtering method is suitably used for forming an inorganic insulating material such as silicon oxide or silicon nitride. A wet process such as a spin coating method or a screen printing method is suitably used for forming an organic insulating material. By these methods, a film of a densified structure having reduced defects such as pinholes can be formed.

Above all, the inorganic insulating layer is preferably formed by the plasma-enhanced CVD method so as to form a film having a more densified structure. By this method, a film having a structure with high density can be formed even when an insulating layer having a small thickness of ca. 30 to 100 nm, as well as a large thickness of about 200 nm, is formed.

For example, when the photoelectric conversion section 50 has on its surface a textured structure (uneven structure) as shown in FIG. 1, the insulating layer is preferably formed by the plasma-enhanced CVD method so that a densified film may be formed even at recessed and raised portions of the texture. By using an insulating layer having high density, damage to the transparent electrode layer during a plating treatment can be reduced, and also deposition of a metal onto the transparent electrode layer can be prevented. The insulating layer having such high density can function as a barrier layer to water, oxygen and the like for a layer within the photoelectric conversion section 50 (e.g., silicon-based thin-films 2a and 3a in the semiconductor-stacked portion), so that an effect of improving long-term reliability of the solar cell can also be expected.

The method for making the outer peripheral portion of the first principal surface of the photoelectric conversion section into an insulating layer-non-formed region is not particularly limited. When the insulating layer 9 is formed by a dry method such as a plasma-enhanced CVD method or a sputtering method, the outer peripheral portion of the transparent electrode layer 6a can be made into the insulating layer-non-formed region 95 by forming the insulating layer 9 while the outer peripheral portion is covered with a mask as shown in FIG. 2 at (C). When the insulating layer 9 is formed by a wet method, the outer peripheral portion may be made into the insulating layer-non-formed region by an appropriate method such as a printing method.

(Transparent Electrode Layer-non-Formed Region)

In the insulating layer-non-formed region, the light-receiving side transparent electrode layer 6a, and electrode layers (back side transparent electrode layer 6b and back side metal electrode 8) deposited to wrap around to the light-receiving side from the back side are exposed to the surface. By removing the electrode layer exposed to the surface, the electrode layer-non-formed region 65 is formed (FIG. 2 at (E)). A short circuit between the electrode layer on the light-receiving side and the electrode layer on the back side is hereby eliminated.

In the heterojunction solar cell, a silicon-based thin-film is formed between the crystalline silicon substrate and the transparent electrode layer, so that recombination of carriers at the crystalline silicon substrate interface is suppressed. Preferably, a silicon-based thin-film is also formed in the transparent electrode layer-non-formed region for suppressing the recombination of carriers. Therefore, it is preferred that the electrode layer exposed to the insulating layer-non-formed region is removed by a method in which the electrode layer is selectively removed, but the silicon-based thin-film formed under the electrode layer is not removed. Therefore, it is preferred to perform removal of the electrode layer by wet etching.

An etchant for wet etching can be appropriately selected according to a material of the electrode layer. Generally, an acidic solution is used for etching a metal oxide. Hydrochloric acid, ferric chloride, sulfuric acid, or the like is applicable for etching the transparent electrode layer mainly composed of indium oxide.

When the back side metal electrode 8 is formed on the back side transparent electrode layer 6b, the metal electrode layer acts as a protecting layer when the back side metal electrode has chemical durability to an etchant. Therefore, as shown in FIG. 2 at (E), the back side transparent electrode layer 6 and back side metal electrode 8 deposited to wrap around to the light-receiving side remain without being removed. Thus, when the back side metal electrode 8 is formed on the whole surface of the back side transparent electrode layer 6b, the back side transparent electrode layer 6b can be protected against an etchant with the back side metal electrode as a protecting layer in removal of the surface-side transparent electrode layer on the outer peripheral portion on the light-receiving side by etching. Therefore, only the electrode layer exposed to the outer peripheral portion on the light-receiving side can be easily selectively removed.

Figure 3A:
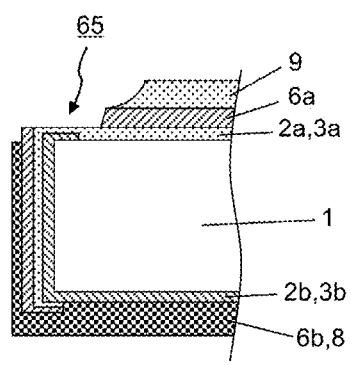
FIG. 3A is a schematic sectional view showing a structure of an outer peripheral portion of a solar cell according to one embodiment of the present invention.
Figure 3B:
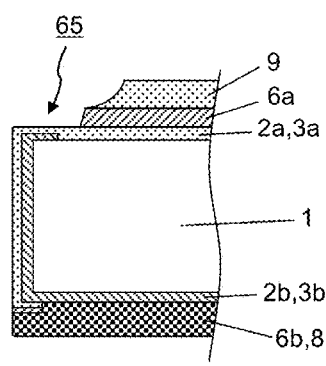
FIG. 3B is a schematic sectional view showing a structure in a vicinity of an outer peripheral portion of a solar cell according to one embodiment of the present invention.

In the configuration shown in FIG. 2 at (E), the electrode layer remains without being removed at an outer peripheral end of the first principal surface of the photoelectric conversion section on the outer periphery side with respect to the electrode layer-non-formed region 65 (boundary portion between the first principal surface and the side surface). On the other hand, when the back side metal electrode is not formed on the outer peripheral portion of the photoelectric conversion section, or an etchant capable of dissolving the back side metal electrode is used, the electrode layer-non-formed region 65 is formed so as to extend to the outer peripheral end of the first principal surface of the photoelectric conversion section as shown in FIG. 3A. The electrode layer-non-formed region 65 may be formed so as to extend to the side surface of the photoelectric conversion section as shown in FIG. 3B. The electrode layer-non-formed region may be formed so as to extend around to the outer peripheral portion on the back side.

When the electrode layer-non-formed region 65 extends to the outer peripheral end of the photoelectric conversion section as shown in FIG. 3A and FIG. 3B, a tab wire connected to the collecting electrode does not come into contact with the electrode layer, which is deposited to wrap around to the outer peripheral end on the light-receiving side from the back side, in modularization of solar cells. Therefore, an undesired short circuit through an interconnector such as a tab wire used for modularization can be suppressed.

In the present invention, the second electroconductive layer 72 of the collecting electrode 70 is formed by a plating method as described in detail later. In a preferred mode of the present invention, the same kind of chemical solution as the plating solution to be used for formation of the second electroconductive layer is used as an etchant for removing the electrode layer. The same kind of chemical solution as the plating solution means a chemical solution containing a principal component that is also contained in the plating solution.

Preferably, elimination of a short circuit between electrode layers on the front and the back surfaces by etching the electrode layers (formation of the electrode layer-non-formed region) is performed in the plating step for simplifying the process. The phrase "elimination of a short circuit is performed in the plating step" means that the transparent electrode layer is removed using a plating solution as an etchant in a plating apparatus used in the plating step. When the electrode layer is removed in the plating step, the process is simplified to improve productivity of the solar cell. Since etching and plating are performed in the same solution, the generation amount of wastes such as a waste liquid can be reduced. Further, since etching and plating are performed in a series of steps, transference of a substrate in the process can be reduced to suppress deficiencies such as damage of the substrate.

Preferably, an etchant and an electrode layer material remaining on the photoelectric conversion section are washed away after the electrode layer is removed by wet etching. When the same kind of chemical solution as the plating solution to be used for formation of the second electroconductive layer is used as an etchant as described above, washing after elimination of a short circuit can be omitted, or simplified. When a short circuit is eliminated by etching in the plating step, washing between elimination of the short circuit and formation of the second electroconductive layer can be omitted.

(Transparent Electrode Layer-Transition Region)

When deposition is performed using a mask, a "transition region," where the coverage and the thickness of a thin-film are smaller as compared to other regions (mainly-formed regions which are not shielded with a mask and have a constant thickness), is formed in the vicinity of the boundary between a mask shielding region and a non-shielding region.

For example, on the non-shielding region side of the boundary, deposition particles coming flying in a direction inclined with respect to the normal line of the deposition surface are blocked off by the mask, and therefore the thickness and the coverage become smaller as compared to the mainly-formed region. Since the mask 81 is not in full contact with the shielding object (transparent electrode layer 6*a*), and there is a gap therebetween, a transition region is also formed on the shielding region side of the boundary due to a deposition penetrating into the gap.

Accordingly, a thin-film deposited using a mask includes a transition region between a mainly-formed region and a film-non-formed region. In the present invention, the "mainly-formed region" of a thin-film means a region wherein the thin-film is formed without being restricted by a deposition mask or the like during deposition, typically a region where the thickness is constant.

A thin-film formed by a sputtering method or a CVD method has a certain degree of surface roughness ascribable to influences of an island structure formed in the early stage of deposition, influences of an isotropic crystal growth, and so on. In the case where the thin-film has surface roughness ascribable to a deposition process, film thicknesses are measured in a region sufficiently wider than the scale of the irregularity structure of the surface roughness (e.g., a region that is ten times or more the roughness period), and an average of the thicknesses is evaluated; when there is no difference in thickness among evaluation spots, the region can be regarded as having constant thickness (mainly-formed region). When the film surface as an underlay for deposition has surface roughness (for example, the silicon substrate has a textured structure), the deposition surface also has surface roughness ascribable to the surface roughness of the underlying layer. In this case where thicknesses of the thin-film are evaluated in a region where surface roughness of the underlying surface is negligible (e.g., a region sufficiently smaller than the roughness period of the underlying surface) and there is no difference in thickness among evaluation spots, the region can be regarded as having constant thickness (mainly-formed region).

Figure 4A:
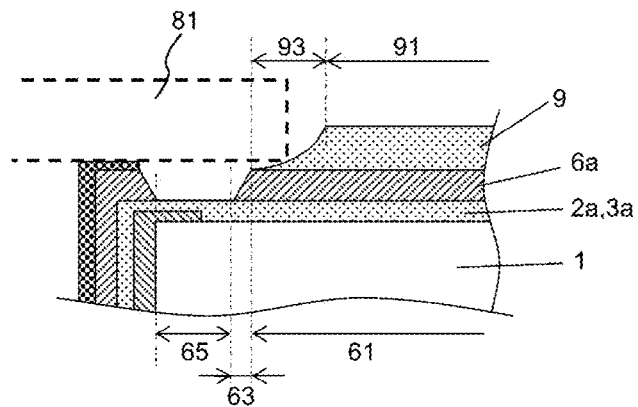
FIG. 4A is a schematic sectional view showing a structure in a vicinity of an outer peripheral portion of a solar cell according to one embodiment of the present invention.
Figure 4B:
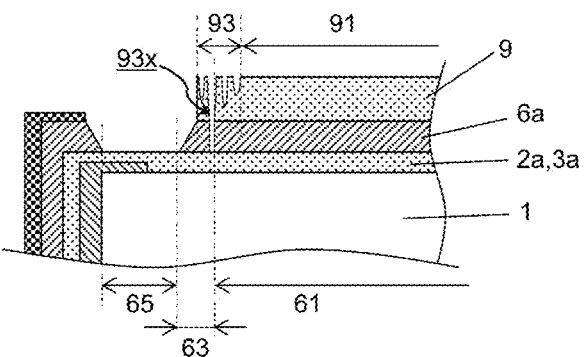
FIG. 4B is a schematic sectional view showing a structure in a vicinity of an outer peripheral portion of a solar cell according to one embodiment of the present invention.
Figure 4C:
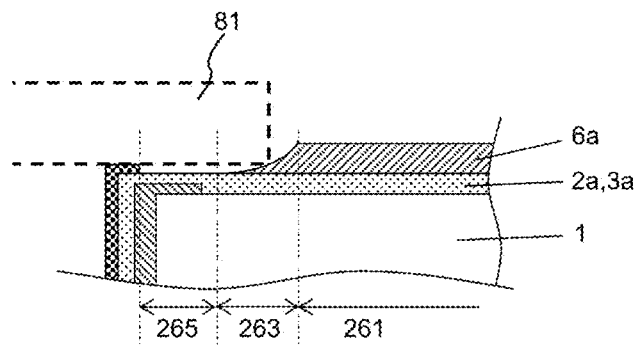
FIG. 4C is a schematic sectional view showing a structure in a vicinity of an outer peripheral portion of a solar cell according to prior art.

FIG. 4C is a conceptual view schematically showing a state in the vicinity of the outer peripheral portion of the photoelectric conversion section when the transparent electrode layer 6*a* is formed while the outer peripheral portion is shielded with the mask 81. In FIG. 4C, the transparent electrode layer 6*a* has a transparent electrode layer-transition region 263 adjacent to a transparent electrode layer-mainly-formed region 261. An electrode layer-non-formed region 265 is adjacent to the transparent electrode layer-transition region 263.

As shown here, a short circuit between the front and the back surfaces can also be prevented by the electrode layer-non-formed region 265 using a method in which a transparent electrode layer is formed using a mask. In this case, the width of the transparent electrode layer-transition region 263 is about 1 mm. In the transparent electrode layer-transition region 263, carriers cannot be sufficiently collected because the thickness and the coverage are smaller and the resistance is higher as compared to the transparent electrode layer-mainly-formed region 261.

FIG. 4A is a conceptual view schematically showing a state in the vicinity of the outer peripheral portion of the photoelectric conversion section when the transparent electrode layer 6*a* is formed without using a mask, the insulating layer 9 is formed thereon using a mask, and the electrode layer-non-formed region 65 is then formed by wet etching. In this case, an insulating layer-transition region 93 is formed at the end (outer peripheral portion) of the insulating layer 9 because the insulating layer 9 is formed using a mask.

The width of the insulating layer-transition region 93 in FIG. 4A is substantially equal to the width of the transparent electrode layer-transition region 263 in FIG. 4C. On the other hand, in removal of the transparent electrode layer by etching, not only the insulating layer-mainly-formed region 91 but also the insulating layer-transition region 93 serves as a protecting layer for the transparent electrode layer 6*a*. Therefore, the width of the transparent electrode layer-transition region 63 can be made smaller than the width of the insulating layer-transition region 93. Accordingly, by performing etching using as a protecting layer the insulating layer 9 formed on the transparent electrode layer 6*a*, the width of the transparent electrode layer-transition region can be made smaller as compared to a case where the transparent electrode layer is formed using a mask as in FIG. 4C.

When a light-receiving side transparent electrode layer is formed while the silicon-based thin-film 3*a* is covered with a mask, physical damages such as scratches and scrapes may occur in the silicon-based thin-film due to contact between the silicon-based thin-film and the mask. When the transparent electrode layer 6*a* is formed without using a mask, deterioration of solar cell characteristics can be prevented because damages due to contact between the silicon-based thin-film and the mask do not occur. When the insulating layer 9 is formed while the light-receiving side transparent electrode layer 6*a* is covered with a mask, physical damages may occur in the transparent electrode layer due to contact between the transparent electrode layer and the mask. However, the thickness of the transparent electrode layer can be made sufficiently larger than that of the silicon-based thin-film, and therefore, even when physical damages due to contact with a mask, etc., occur, deterioration of solar cell characteristics can be minimized.

In FIG. 4A, a transition region having a thickness smaller than that of the mainly-formed region is described, but the transition region may also have a smaller coverage as compared to the mainly-formed region. For example, on the outer peripheral portion of the insulating layer-formed region, the insulating layer is easily formed in valleys (recess portions) of the textured structure of the silicon substrate, and regions where locally have no insulating layer (insulating layer-deficit portions) 93*x*, and regions where the thickness of the insulating layer is locally small are easily formed on mountains (projection portions) of the textured structure of the silicon substrate. Therefore, on the outer peripheral portion of the insulating layer 9, the insulating layer-transition region 93 having a smaller coverage as compared to the insulating layer-mainly-formed region 91 may be formed as shown in FIG. 4B. Particularly, when the insulating layer 9 is formed by a coating method such as printing, a transition region having a smaller coverage as compared to the mainly-formed region tends to be formed as shown in FIG. 4B.

When a transparent electrode layer covered with the insulating layer is etched, the transparent electrode layer 6*a* immediately below the insulating layer-transition region 93 is etched to form the transparent electrode layer-transition region 63. At this time, in the insulating layer-transition region 93, the transparent electrode layer immediately below pinhole-like deficit portions extending through the insulating layer is etched, but in a region where the insulating layer 9 locally has a small thickness, the insulating layer 9 acts as an etching mask, and therefore the transparent electrode layer remains without being etched. Therefore, the width of the transparent electrode layer-transition region 63 can be made smaller than the width of the insulating layer-transition region 93.

In both the case where the insulating layer is formed using a mask (e.g., FIG. 4A) and the case where the insulating layer is formed by coating (e.g., FIG. 4B), the width of the transparent electrode layer-transition region 63 can be made smaller than the width of the transparent electrode layer-transition region 263 where the transparent electrode layer is formed using a mask (FIG. 4C). Thus, the solar cell of the present invention can exhibit high solar cell characteristics because a short circuit between electrode layers on the front and the back surfaces is eliminated, and the width of the transparent electrode layer-transition region is small.

The width of the transparent electrode layer-transition region 63, i.e., the width between the end of the transparent electrode layer-mainly-formed region 61 and the end of the electrode layer-non-formed region 65 is preferably 0.5 mm or less, more preferably 0.3 mm or less. The width of the transparent electrode layer-transition region 63 is preferably as small as possible, but in wet etching, it is difficult to make the etching width completely uniform in the thickness direction. Therefore, the width of the transparent electrode layer-transition region is generally 0.001 mm or more. When strict patterning as in laser processing and a photolithography method is not performed, the width of the transparent electrode layer-transition region is generally 0.01 mm or more.

As a method for eliminating a short circuit between electrode layers on the front and the back surfaces, a method in which the outer peripheral portion of the photoelectric conversion section is removed by laser processing or the like is known in addition to a method using a mask. According to this method, a thin-film deposited on the side surface is removed together with the outer peripheral portion of silicon, and therefore the transparent electrode layer-transition region can be made to have substantially no width (less than 1 μm). However, when the outer peripheral portion is removed, the power generation area decreases, and therefore solar cell characteristics (power generation amount) are deteriorated. On the electrode layer-non-formed region (side surface of the silicon substrate) generated by removing the outer peripheral portion of the substrate, not only the electrode layer but also the silicon-based thin-film layer is removed, so that the silicon substrate is exposed. Therefore, carrier recombination is facilitated on the side surface of the silicon substrate, so that solar cell characteristics tend to be deteriorated. When solar cells are modularized and put into practical use, metal components in the collecting electrode, etc., and metal components (such as Na) in the glass substrate of the module are easily diffused into the silicon substrate from the exposed area of the silicon substrate, so that reliability of the solar cell tends to be deteriorated.

On the other hand, according to the method of the present invention, the width of the transparent electrode layer-transition region can be reduced without decreasing the power generation area. Since the silicon-based thin-film is persistently formed on the electrode layer-non-formed region, the recombination of carriers and diffusion of metal components to the silicon substrate are suppressed, so that enhancement of efficiency and improvement of reliability are effectively achieved.

[Collecting Electrode]

A collecting electrode 70 is formed on the first principal surface of the photoelectric conversion section. The collecting electrode 70 includes a first electroconductive layer 71 and a second electroconductive layer 72. The first electroconductive layer 71 is a layer that functions as an electroconductive underlying layer when the second electroconductive layer is formed by a plating method, and the second electroconductive layer is formed by a plating method using the first electroconductive layer 71 as a seed.

By providing the first electroconductive layer 71 as an underlying layer for plating, contact resistance between the transparent electrode layer and the collecting electrode can be reduced to improve conversion efficiency (particularly fill factor) of the solar cell. By providing the first electroconductive layer, adhesion between the transparent electrode layer and the collecting electrode can be improved.

Figure 5:
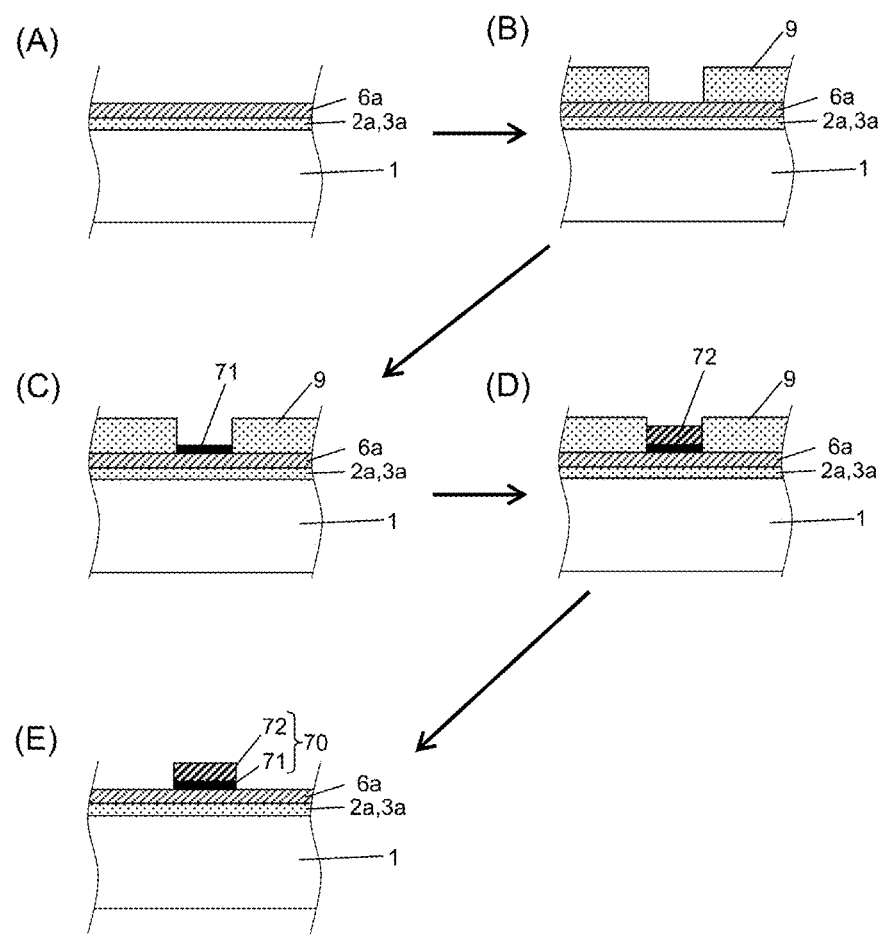
FIG. 5 is a conceptual flow chart showing a formation step of a collecting electrode according to one embodiment.

FIG. 5 is a conceptual flow chart showing a formation step of a collecting electrode according to one embodiment of the present invention. First, an insulating layer 9 having an opening corresponding to the shape of the collecting electrode is formed on the transparent electrode layer 6a (FIG. 5 at (B)). As described previously, this insulating layer 9 functions as an etching mask during formation of an electrode layer-non-formed region on the outer peripheral portion of the photoelectric conversion section.

Next, a first electroconductive layer 71 is formed on the opening section of the insulating layer 9 on the transparent electrode layer 6a (first electroconductive layer forming step; FIG. 5 at (C)). Thereafter, on the first electroconductive layer 71, a second electroconductive layer 72 is deposited by a plating method (second electroconductive layer forming step; FIG. 5 at (D)). Thereafter, the insulating layer 9 is removed as necessary (FIG. 5 at (E)).

As shown in FIG. 5 at (D), the insulating layer 9 also functions as a plating resist to protect the transparent electrode layer 6a against a plating solution and suppress deposition of a plating metal on regions other than the first electroconductive layer-formed region. Accordingly, in the present invention, the insulating layer formed on the transparent electrode layer serves as both a protecting layer against an etchant in formation of the electrode layer-non-formed region and a protecting layer against a plating solution in formation of the second electroconductive layer by a plating method. Therefore, elimination of a short circuit (insulation) between electrode layers on the front and the back surfaces and formation of the collecting electrode by a plating method can be performed without increasing the number of steps, and a solar cell excellent in characteristics can be obtained.

The first electroconductive layer 71 is a layer that functions as an electroconductive underlying layer when the second electroconductive layer 72 is formed by a plating method. Therefore, it suffices that the metal seed has such a level of electroconductivity that it can function as an underlying layer for electroplating. In this specification, those having a volume resistivity of $10^{-2}$ Ω·cm or less are defined as being electroconductive. Those having a volume resistivity of $10^{2}$ Ω·cm or more are defined as insulating.

The thickness of the first electroconductive layer 71 is preferably 0.1 μm or more, more preferably 0.2 μm or more, so that the line resistance of the first electroconductive layer 71 falls within a desired range. When an electroconductive paste is used for a material of the first electroconductive layer 71, the thickness of the first electroconductive layer is preferably 0.5 μm or more, more preferably 1 μm or more. On the other hand, in terms of cost, the thickness of the first electroconductive layer 71 is preferably 20 μm or less, more preferably 10 μm or less, further preferably 5 μm or less.

The first electroconductive layer 71 can be prepared by a known technique such as wet process including an inkjet method, a screen printing method, spray method, and the like; a dry process including a vacuum deposition method, a sputtering method, CVD method, and the like; a conductor wire bonding method and the like.

The first electroconductive layer 71 is preferably patterned in a specific shape such as a comb-like pattern. When the electroconductive paste is used for the material of the first electroconductive layer 71, the screen printing method is suitable for formation of the patterned first electroconductive layer, in terms of productivity. For the screen printing method, a method is suitably used in which a pattern corresponding to a shape of the collecting electrode is printed using a printing paste containing metal particles and a screen plate having an opening pattern corresponding to the pattern shape of the collecting electrode. When the first electroconductive layer 71 is formed by a dry process, an opening pattern corresponding to the shape of the collecting electrode is provided beforehand in the insulating layer 9 as shown in FIG. 5 at (B), and deposition is performed using the insulating layer 9 as a mask, thereby the first electroconductive layer 71 having a pattern corresponding to the shape of the collecting electrode can be formed. The first electroconductive layer may be patterned after the first electroconductive layer is formed on substantially the whole of the first principal surface of the photoelectric conversion section, a plating resist or the like is provided thereon, and the second electroconductive layer having a predetermined pattern is formed by a plating method (see FIG. 8).

The first electroconductive layer 71 may also be formed by a plating method. For example, the first electroconductive layer composed of a material different from that of the second electroconductive layer may be formed by an electroplating method. The first electroconductive layer may be formed by a light induced plating or an electroless plating.

For example, when a metal mainly composed of copper is deposited by electroplating as the second electroconductive layer 72, contact resistance between the transparent electrode layer 6a and the plating metal layer 72 can be reduced by forming as the first electroconductive layer 71, a metal layer mainly composed of, for example, nickel by electroless plating. As one example, the first electroconductive layer 71 composed of NiP can be formed on the transparent electrode layer 6a by keeping a plating solution, which contains sodium hypophosphite and nickel sulfate, in contact with a surface of the transparent electrode layer 6a for a predetermined time. When the first electroconductive layer is formed by electroless plating, it is preferred to perform an activation treatment before plating. For example, when a first electroconductive layer composed of NiP is formed by electroless plating, acid activation can be performed by bringing a surface of the transparent electrode layer 6a into contact with a catalyst solution containing palladium chloride and stannous chloride, and then with an acidic solution.

(Second Electroconductive Layer)

After the insulating layer 9 and the first electroconductive layer 71 are formed as described above, a second electroconductive layer 72 is formed by a plating method with the first electroconductive layer 71 as an origination point. The metal deposited as the second electroconductive layer is not particularly limited as long as it is a material that can be formed by a plating method, and for example, copper, nickel, tin, aluminum, chromium, silver, gold, zinc, lead, palladium, or the like, or a mixture thereof can be used.

Electric current principally passes through the second electroconductive layer during operation (electricity generation) of the solar cell. Thus, the line resistance of the second electroconductive layer is preferably as low as possible so as to suppress ohmic loss in the second electroconductive layer. Specifically, the line resistance of the second electroconductive layer is preferably 1 $\Omega$/cm or less, more preferably 0.5 $\Omega$/cm or less. On the other hand, it suffices that the line resistance of the first electroconductive layer is so low that the layer can function as an underlying layer at the time of electroplating, with an example thereof being 5 $\Omega$/cm or less.

The second electroconductive layer can be formed by either of an electroless plating method and an electroplating method. The electroplating method is suitably used in order to increase productivity. In the electroplating method, the rate of deposition of a metal can be increased, so that the second electroconductive layer can be formed in a short time.

Figure 6:
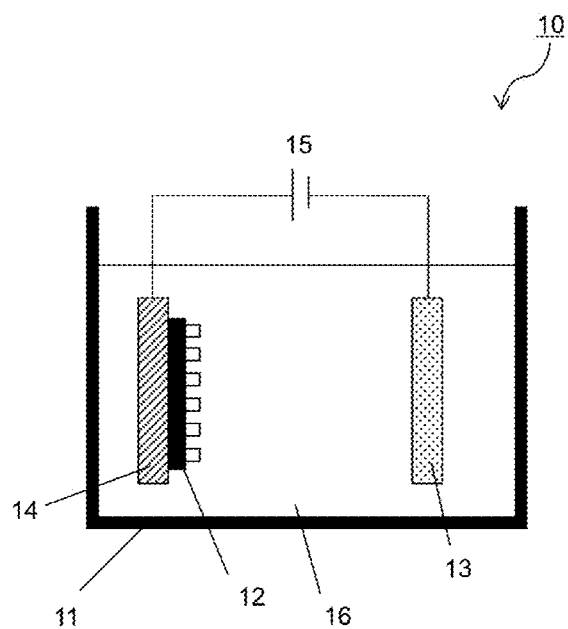
FIG. 6 is a structural schematic view of a plating apparatus.

A method for forming a second electroconductive layer by the electroplating method will be described taking acidic copper plating as an example. FIG. 6 is a conceptual view of a plating apparatus 10 that is used for forming the second electroconductive layer. A substrate 12 having a first electroconductive layer and an insulating layer on a photoelectric conversion section and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited with a part of the first electroconductive layer as an origination point, which is not covered with the insulating layer 9.

When removal of the electrode layer on the outer peripheral portion by etching for eliminating a short circuit between electrodes on the front and the back surfaces is performed through the plating step, the substrate 12 is immersed in a plating tank to remove the electrode layer exposed to the surface of the insulating layer-non-formed region. At this time, for preventing deposition of metals on the electrode layer exposed to the surface of the insulating layer-non-formed region, it is preferred that after the substrate is immersed in the plating tank, the second electroconductive layer is formed by feeding electricity after the electrode layer exposed to the surface of the insulating layer-non-formed region is removed by etching.

The plating solution 16 used for acidic copper plating contains copper ions. For example, a solution of known composition, which has copper sulfate, sulfuric acid, and water as main components, can be used, and by causing a current of 0.1 to 10 A/dm$^2$ to pass therethrough, a metal as the second electroconductive layer can be deposited. The suitable plating time is appropriately set according to the area of a collecting electrode, the current density, cathode current efficiency, desired thickness, and so on.

The second electroconductive layer may be composed of a plurality of layers. For example, by forming a first plating layer, made of a material having a high electroconductivity, such as Cu, on the first electroconductive layer, and then forming on the surface of the first plating layer a second plating layer excellent in chemical stability, a collecting electrode having low resistance and being excellent in chemical stability can be formed.

(Removal of Plating Solution)

Figure 8:
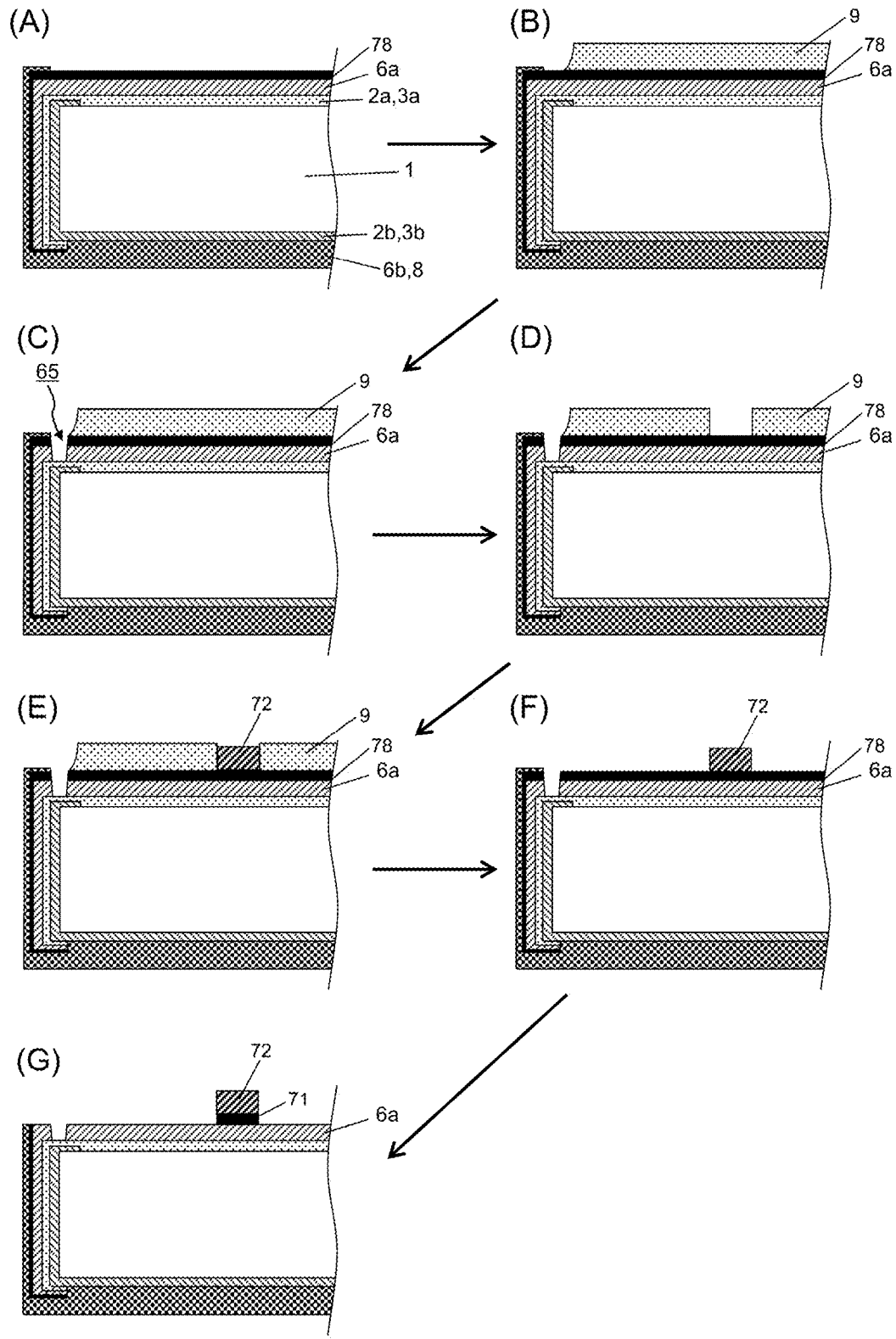
FIG. 8 is a conceptual flow chart showing a production process for a solar cell according to one embodiment of the present invention.

In the present invention, an insulating layer removing step shown in FIG. 5 at (E) and FIG. 8 at (F) may be performed after forming the second electroconductive layer (plating step). In particular, when a material having a large optical absorption is used as the insulating layer, the insulating layer removing step is preferably performed for suppressing reduction of solar cell characteristics by the optical absorption of the insulating layer. The method for removing the insulating layer is appropriately selected according to the characteristics of the insulating layer material. For example, the insulating layer can be removed by chemical etching or mechanical polishing. An ashing (incineration) method is also applicable depending on the material. At this time, it is preferable that the insulating layer on the first electroconductive layer-non-formed region is entirely removed, so that an influx of light is further improved.

It is preferable that after carrying out the plating step, a plating solution removing step is provided to remove a plating solution remaining on the surface of the substrate 12. By providing the plating solution removing step, a metal that can be deposited at a part other than the first electroconductive layer-formed region as an origination point can be removed. Examples of the metal deposited at a part other than at the first electroconductive layer-formed region as an origination point include those deposited at a pinhole in the insulating layer 9 as an origination point. As a result of removing such a metal by the plating solution removing step, a shading caused by the metal is reduced, so that solar cell characteristics can be further improved.

Here, generally a transparent electrode layer of ITO or the like and an insulating layer of silicon oxide or the like are hydrophilic, and the contact angle of the surface of the substrate 12 or the surface of the insulating layer 9 with water is often about 10° or less. On the other hand, the contact angle of the surface of the substrate 12 with water is preferably 20° or more for facilitating removal of a plating solution by air blowing or the like. For increasing the contact angle at the surface of the substrate, the surface of the substrate 12 may be subjected to a water-repellent treatment. The water-repellent treatment is performed by, for example, forming a water-repellent layer on the surface. By the water-repellent treatment, wettability of the surface of the substrate to a plating solution can be reduced.

In place of the water-repellent treatment of the surface of the insulating layer 9, the insulating layer 9 having water repellency may be formed. That is, by forming the insulating layer 9 having a large contact angle θ (e.g., 20° or more) with water, an optional water-repellent treatment step can be omitted, and therefore productivity of the solar cell can be further improved. Examples of the method for imparting water repellency to the insulating layer include a method in which a silicon oxide layer as the insulating layer is formed by a plasma-enhanced CVD method with the conditions for deposition of the insulating layer (e.g., the flow ratio between a silicon raw material gas and an oxygen raw material gas introduced into a deposition chamber) changed.

[Other Modes for Forming Collecting Electrode]

In FIG. 4, an example of a method in which the first electroconductive layer is formed in the opening section of the insulating layer 9, and the second electroconductive layer is formed thereon by a plating method is described, but the method for forming the collecting electrode is not limited to the above-mentioned method. The insulating layer 9 may be formed either before or after the first electroconductive layer forming step as long as the insulating layer 9 is formed before the second electroconductive layer is formed by plating. For example, when the insulating layer is formed before the first electroconductive layer forming step, the insulating layer can be formed on a portion other than the region where the first electroconductive layer is formed (first electroconductive layer-non-formed region) while a portion corresponding to the shape of the first electroconductive layer is covered with a mask. When the insulating layer is formed after the first electroconductive layer forming step, the insulating layer is formed at least on the first electroconductive layer-non-formed region.

The insulating layer having an opening section corresponding to the shape of the first electroconductive layer may be formed after formation of the first electroconductive layer having a pattern shape corresponding to the shape of the collecting electrode. After the first electroconductive layer is formed, the insulating layer can also be formed on the first electroconductive layer-formed region, followed by forming the second electroconductive layer on the first electroconductive layer with the opening section of the insulating layer as an origination point.

Figure 7:
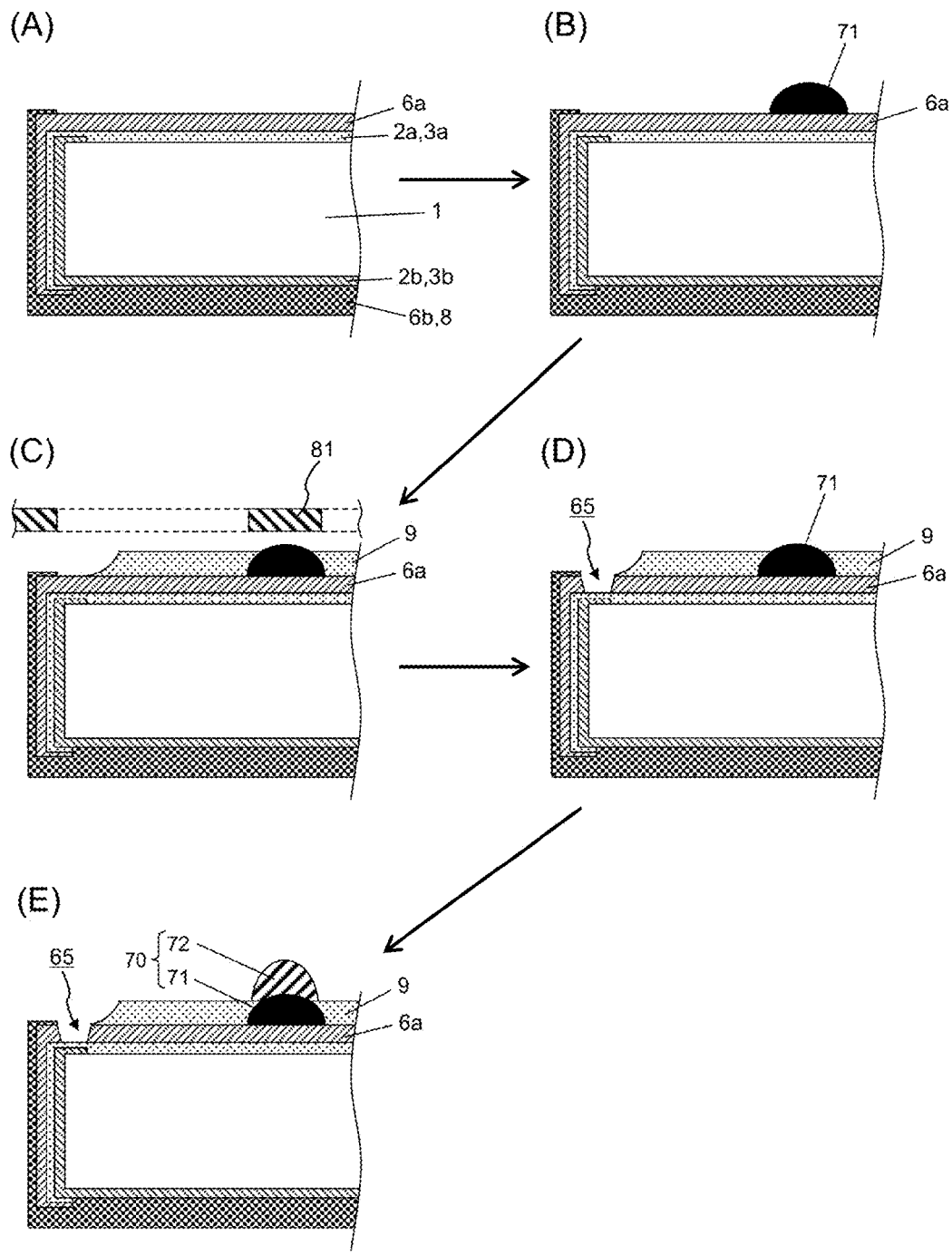
FIG. 7 is a conceptual flow chart showing a production process for a solar cell according to one embodiment of the present invention.

For example, as shown in FIG. 7, when the first electroconductive layer 71 is formed on the transparent electrode layer 6a (FIG. 7 at (B)), and the insulating layer 9 is formed while not only the outer peripheral portion of the photoelectric conversion section but also the first electroconductive layer 71 is covered with the mask 81, the opening section of the insulating layer 9 is formed on the first electroconductive layer-formed region (FIG. 7 at (C)). When the outer peripheral portion is made into the electrode layer-non-formed region 65 by etching (FIG. 7 at (D)), and electricity is fed to the first electroconductive layer 71 to perform plating, the second electroconductive layer 72 can be formed with the opening section of the insulating layer 9 on the first electroconductive layer 71 as an origination point (FIG. 7 at (E)).

As shown in FIG. 8, the insulating layer 9 having an opening section of a predetermined shape may be formed after the first electroconductive layer is formed on the transparent electrode layer. In this mode, the first electroconductive layer 78 is formed on the whole surface of the light-receiving side transparent electrode layer 6a (FIG. 8 at (A)). In this case, it is preferred that the first electroconductive layer 78 is formed by a dry method similarly to the transparent electrode layer 6a. The first electroconductive layer 78 can also be formed on the transparent electrode layer 6a by electroless plating, etc.

The insulating layer 9 is formed on the first electroconductive layer 78 (FIG. 8 at (B)). At this time, it is preferred to prevent the insulating layer from being formed on the outer peripheral portion of the photoelectric conversion section using an appropriate method such as a method in which deposition is performed with the outer peripheral portion covered with a mask. The insulating layer 9 may have an opening section in a pattern of the collecting electrode-formed region. In the mode shown in FIG. 8, the opening section is not formed on the collecting electrode-formed region during formation of the insulating layer. Therefore, at the time when the first electroconductive layer and the transparent electrode layer on the insulating layer-non-formed region on the outer peripheral portion are removed by etching, the first electroconductive layer and the transparent electrode layer on the collecting electrode-formed region can be prevented from being removed by etching.

The first electroconductive layer 78 and the transparent electrode layer 6a exposed to the surface of the insulating layer-non-formed region on the outer peripheral portion of the photoelectric conversion section are removed by etching, and the left portion becomes the electrode layer-non-formed region 65 (FIG. 8 at (C)). The first electroconductive layer and the transparent electrode layer may be removed by the same etchant. Or, after the removal of the first electroconductive layer by etching, removal of the transparent electrode layer 6a exposed to the region where the first electroconductive layer has been removed may be performed by etching using a different etchant.

After the electrode layer-non-formed region is formed on the outer peripheral portion of the photoelectric conversion section, an opening section corresponding to the shape of the collecting electrode is formed in the insulating layer 9 (FIG. 8 at (D)). The method for forming an opening is not particularly limited. For example, when a photoresist is used as a material of the insulating layer 9, it is preferred that the opening section is formed by photolithography. Photolithography has high accuracy and reproducibility of formation of the opening section, so that the shape of the collecting electrode can be made uniform to suppress an increase in shading area. Photolithography can also be used in formation of the insulating layer-non-formed region on the outer peripheral portion of the photoelectric conversion section. However, the insulating layer-non-formed region on the outer peripheral portion does not require the high positional accuracy that is required during formation of the collecting electrode. Therefore, for simplifying the process, a general printing method (e.g., screen printing or an inkjet method), etc., is employed, rather than photolithography, in formation of the insulating layer-non-formed region on the outer peripheral portion.

After the opening section is formed in the insulating layer, the second electroconductive layer 72 is formed in the opening section of the insulating layer on the first electroconductive layer 78 by a plating method (FIG. 8 at (E)). After the second electroconductive layer is formed, the insulating layer 9 (resist) is removed (FIG. 8 at (F)). When the first electroconductive layer 78 is composed of a light-absorbing or light-reflecting metallic material, it is preferred that the first electroconductive layer 78 is removed (FIG. 8 at (G)). For example, by using an etchant in which the etching rate for the metallic material of the first electroconductive layer is sufficiently higher than the etching rate for the conductive oxide material of the transparent electrode layer, the first electroconductive layer 78 exposed to the surface can be selectively removed without seriously damaging the transparent electrode layer.

In one embodiment of the solar cell of the present invention, the second electroconductive layer 72 is conductively connected with the first electroconductive layer 71. In the solar cell of the present invention, it suffices that at least a part of the second electroconductive layer 72 is conductively connected with the first electroconductive layer 71. Here, the wording "a part of . . . is conductively connected with . . . " typically refers to a state in which a conductive connection is established by forming an opening in the insulating layer and filling the opening with a material of the second electroconductive layer; a state is also included in which a part of the insulating layer has a very small thickness, i.e., only several nanometers (in other words, a region with the small thickness is locally formed), and resultantly the second electroconductive layer 72 is conductively connected with the first electroconductive layer 71.

The method for forming in the insulating layer 9 the opening conductively connecting the first electroconductive layer and the second electroconductive layer with each other is not limited to the method using a mask as shown in FIG. 7 or the photolithography method as shown in FIG. 8, and a method such as laser irradiation, mechanical drilling, or chemical etching may be employed. In one embodiment, a method is used in which a low-melting-point material in the first electroconductive layer is thermally-fluidized to form an opening in an insulating layer formed thereon can be exemplified.

[Formation of Opening in Insulating Layer by Annealing]

Examples of the method for forming an opening by thermal-fluidization of a low-melting-point material in the first electroconductive layer include a method in which the insulating layer 9 is formed on the first electroconductive layer 71 containing a low-melting-point material, and heating (annealing) is performed to a temperature equal to or higher than a thermal-fluidization onset temperature $T_1$ of the low-melting-point material to change the surface shape of the first electroconductive layer, so that an opening (crack) is formed in the insulating layer 9 formed on the first electroconductive layer; and a method in which heating is performed to a temperature equal to or higher than $T_1$ during formation of the insulating layer 9 on the first electroconductive layer 71 containing low-melting-point material so that the low-melting-point material is thermally-fluidized to form an opening simultaneously with formation of the insulating layer.

A method for forming an opening in the insulating layer using thermal-fluidization of a low-melting-point material in the first electroconductive layer will be described below with reference to the drawings.

Figure 9:
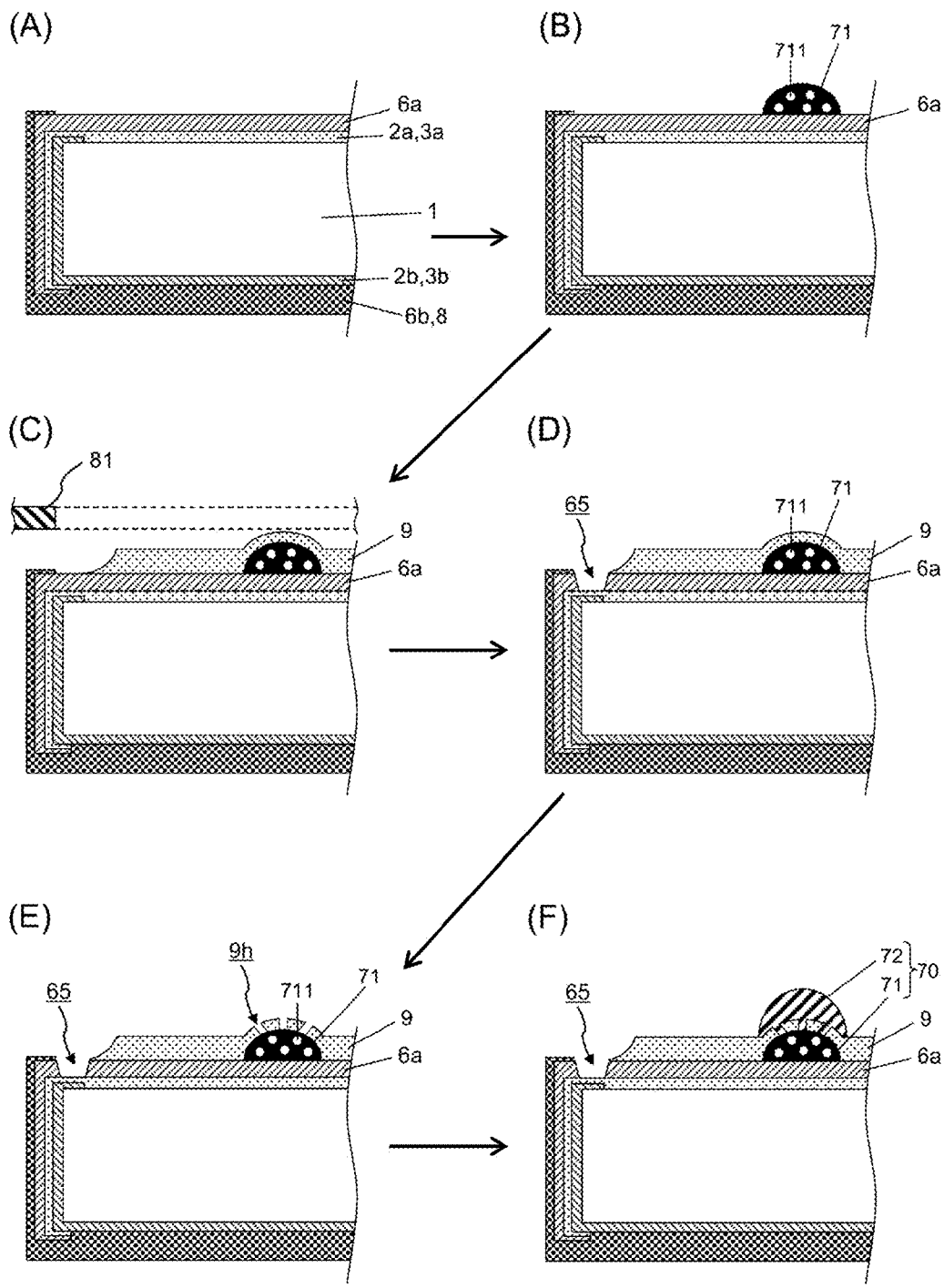
FIG. 9 is a conceptual flow chart showing a production process for a solar cell according to one embodiment of the present invention.

FIG. 9 is a conceptual flow chart showing one embodiment of a method for forming a collecting electrode 70 on a photoelectric conversion section 50 of a solar cell. In this embodiment, first, the photoelectric conversion section 50 is provided (photoelectric conversion section providing step; FIG. 9 at (A)).

For example, in the case of a heterojunction solar cell, a photoelectric conversion section including a silicon-based thin-film and a transparent electrode layer are provided on a crystal silicon substrate, as described above. The photoelectric conversion section includes a light-receiving side transparent electrode layer 6a as an outermost layer of the first principal surface side. In this embodiment, the light-receiving side transparent electrode layer 6a is deposited to wrap around to the back side as shown in FIG. 9 at (A). The back side transparent electrode layer 6b is deposited to wrap around to the light-receiving side. The back side metal layer 8 is also deposited to wrap around to the light-receiving side.

A first electroconductive layer 71 containing a low-melting-point material 711 is formed on the first principal surface of the photoelectric conversion section (first electroconductive layer forming step; FIG. 9 at (B)). An insulating layer 9 is formed on the first electroconductive layer 71 (an insulating layer forming step; FIG. 9 at (C)). At this time, the insulating layer 9 is also formed on a region (first electroconductive layer-non-formed region) of the photoelectric conversion section 50 where the first electroconductive layer 71 is not formed. As described above, the insulating layer 9 is not formed on the outer peripheral portion of the transparent electrode layer 6a, and on the insulating layer-non-formed region, the electrode layer 6a is exposed to the surface.

After the insulating layer is formed, the transparent electrode layer on the insulating layer-non-formed region is removed to form a transparent electrode layer-non-formed region where the transparent electrode layer is not formed (short circuit eliminating step, FIG. 6(D)). At this time, the transparent electrode layer-non-formed region and the transparent electrode layer-transition region are formed on the first principal surface, the second principal surface, or the side surface of the photoelectric conversion section, so that a leakage current resulting from a short circuit between the front and the back surfaces is reduced. By formation of the transparent electrode layer-non-formed region, a short circuit between the first principal surface and the second principal surface of the photoelectric conversion section is eliminated.

In this embodiment, the transparent electrode layer-non-formed region and the transparent electrode layer-transition region are formed on the first principal surface of the photoelectric conversion section. The transparent electrode layer-transition region is formed to have a thickness and/or coverage smaller than that of the transparent electrode layer-mainly-formed region. The transparent electrode layer-formed region where the transparent electrode layer is formed has the transparent electrode layer-mainly-formed region and the transparent electrode layer-transition region. The transparent electrode layer-transition region is formed between the transparent electrode layer-mainly-formed region and the transparent electrode layer-non-formed region as described above, and at least one of the coverage and the thickness of the transparent electrode layer on the transparent electrode layer-transition region is smaller as compared to the transparent electrode layer-mainly-formed region.

Thereafter, annealing treatment by heating is performed (annealing step; FIG. 6(E)). By the annealing treatment, the first electroconductive layer 71 is heated to an annealing temperature Ta, so that the low-melting-point material is thermally-fluidized to thereby change the surface shape, and accordingly the insulating layer 9 formed on the first electroconductive layer 71 is deformed. Typically, deformation of the insulating layer 9 results in formation of an opening 9h in the insulating layer. The opening 9h is formed in the form of, for example, a crack.

After the formation of the opening in the insulating layer by the annealing treatment, the second electroconductive layer 72 is formed by a plating method (plating step; FIG. 6(E)). The first electroconductive layer 71 is covered with the insulating layer 9, but in a section where the opening 9h is formed in the insulating layer 9, the first electroconductive layer 71 is exposed. Therefore, the first electroconductive layer is exposed to a plating solution, so that metal can be deposited at the opening 9h as an origination point. According to this method, a deposition using a photoresist or a mask is not necessary for forming an opening, and a second electroconductive layer matching the shape of the collecting electrode can be formed by a plating method. As previously described, formation of the transparent electrode layer-non-formed region (removing the short circuit of the electrodes between the front and the back surfaces) may be performed in the plating step for forming the second electroconductive layer.

(First Electroconductive Layer)

In this embodiment, the first electroconductive layer 71 contains a low-melting-point material having a thermal-fluidization onset temperature T1. The thermal-fluidization onset temperature is a temperature at which a material is fluidized by heating to change the surface shape of a layer containing a low-melting-point material, and is typically a melting point. As for polymer materials and glass, a material may be softened to be thermally-fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

The low-melting-point material is preferably thermally-fluidized in the annealing treatment, thus causing a change in the surface shape of the first electroconductive layer 71. Therefore, the thermal-fluidization onset temperature $T_1$ of the low-melting-point material is preferably lower than an annealing temperature Ta. The formation of the opening 9h by annealing (FIG. 9 at (E)) is preferably performed at the annealing temperature Ta that is lower than the heat-resistant temperature of the photoelectric conversion section. Therefore, the thermal-fluidization onset temperature $T_1$ of the low-melting-point material is preferably lower than the heat-resistant temperature of the photoelectric conversion section.

The heat-resistant temperature of the photoelectric conversion section is a temperature at which characteristics of a solar cell including the photoelectric conversion section or a solar cell module prepared using the solar cell are irreversibly reduced. For example, in the heterojunction solar cell 101 shown in FIG. 1, the crystal silicon substrate that forms the photoelectric conversion section 50 hardly undergoes a change in characteristics even when heated to a high temperature of 500° C. or higher, but the transparent electrode layer and the amorphous silicon-based thin-film may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally-fluidized in the first electroconductive layer forming step, so that an amount of surface shape change of the first electroconductive layer in the annealing treatment is increased to facilitate the formation of opening 9h in the insulating layer 9. For example, when the first electroconductive layer is formed by coating or printing, heating may be performed for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic material or an inorganic material as long as the thermal-fluidization onset temperature $T_1$ falls within the aforementioned range. The low-melting-point material may be electroconductive or insulating, but is desired to be an electroconductive metallic material. When the low-melting-point material is a metallic material, the resistance value of the first electroconductive layer can be decreased, so that uniformity of the thickness of the second electroconductive layer can be improved when the second electroconductive layer is formed by the electroplating method. In addition, when the low-melting-point material is a metallic material, the contact resistance between the photoelectric conversion section 50 and the collecting electrode 70 can also be reduced.

As the low-melting-point metallic material, a low-melting metallic material alone or an alloy thereof, or a mixture of a plurality of low-melting metallic materials can be suitably used. Examples of the low-melting metallic material include indium, bismuth, and gallium.

The first electroconductive layer 71 preferably contains, in addition to the aforementioned low-melting-point material, a high-melting-point material having a thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that the conversion efficiency of the solar cell can be improved. For example, when a material with high surface energy is used as the low-melting-point material, the first electroconductive layer 71 is exposed to a high temperature in the annealing treatment, the low-melting-point material is thereby brought into a liquid phase state and as a result, particles of the low-melting-point material aggregate into coarse particles, so that disconnecting occurs in the first electroconductive layer 71 in some cases. In contrast, the high-melting-point material is not brought into a liquid phase state by heating in the annealing treatment, and therefore by including the high-melting-point material in the first electroconductive layer forming material, disconnecting of the first electroconductive layer by coarsening of the low-melting-point material can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material, and the annealing temperature Ta in the annealing treatment preferably satisfy $T_1 < Ta < T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum, or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, the ease of forming an opening in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material:high-melting-point material) is set to in a range of 5:95 to 67:33.

The weight ratio between the low-melting-point material: the high-melting-point material is more preferably set to from 10:90 to 50:50, further preferably set to from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of an opening in the insulating layer by the annealing treatment is facilitated. The particle size $D_L$ of the low-melting-point material is preferably 0.25 μm or more, more preferably 0.5 μm or more. When the first electroconductive layer 71 is formed by a printing method such as screen printing, the particle size of particles can be appropriately set according to, for example, the mesh size of a screen plate. For example, the particle size is preferably smaller than the mesh size, more preferably no more than ½ of the mesh size. When particles are non-spherical, the particle size is defined by the diameter of a circle having an area equal to the projected area of particles (projected area-circle equivalent diameter, Heywood diameter).

The shape of the particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing treatment is non-spherical, the amount of change in the surface shape of the first electroconductive layer is larger because particles become more spherical when heated to the thermal-fluidization onset temperature $T_1$ or higher in the annealing treatment. Therefore, it becomes easy to form an opening in the insulating layer 9 on the first electroconductive layer 71.

As described above, the first electroconductive layer 71 shows electroconductivity, and it suffices that its volume resistivity is $10^{-2}$ Ω·cm or less. The volume resistivity of the first electroconductive layer 71 is preferably $10^{-4}$ Ω·cm or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the high-melting-point material has electroconductivity. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

Besides using the combination of the low-melting-point material and the high-melting-point material described above as the material of the first electroconductive layer 71, conversion efficiency may also be improved by adjusting the size of materials (e.g., particle size) and the like to suppress the disconnecting of the first electroconductive layer due to heating in the annealing treatment. For example, even a material having a high melting point, e.g., silver, copper, or gold, in the form of fine particles having a particle size of 1 μm or less, undergoes sintering-necking (fusion of fine particles) at a temperature lower than the melting point, i.e., about 200° C., or a lower temperature $T_1'$, and therefore can be used as the "low-melting-point material". When heated to the sintering-necking onset temperature $T_1'$ or higher, the material that undergoes sintering-necking is deformed at and near the outer periphery of fine particles, so that the surface shape of the first electroconductive layer can be changed to form an opening in the insulating layer 9. Even when fine particles are heated to the sintering-necking onset temperature or higher, the fine particles retain a solid phase state at any temperature that is lower than a melting point $T_2'$, and therefore disconnecting by coarsening of the material hardly occurs. In this respect, it can be said that the material that undergoes sintering-necking, such as metal fine particles, has an aspect of the "high-melting-point material" as well while being the "low-melting-point material" in the present invention. In the material that undergoes sintering-necking, the sintering-necking onset temperature $T_1'$ can be defined as being equal to a thermal-fluidization onset temperature $T_1$.

For the material forming the first electroconductive layer, a paste or the like containing a binder resin or the like can be suitably used, besides the aforementioned low-melting-point material (and the high-melting-point material). For sufficiently improving the electroconductivity of the first electroconductive layer formed by a screen printing method, it is desirable to cure the first electroconductive layer by a heat treatment. Therefore, for the binder resin contained in the paste, a material that can be cured at the aforementioned drying temperature is preferably used, and an epoxy-based resin, a phenol-based resin, an acryl-based resin, and the like are applicable. This is because in this case, the shape of the low-melting-point material is changed as it is cured, and as shown in FIG. 9 at (E), an opening (crack) is easily generated in the insulating layer near the low-melting-point material in the annealing treatment. It suffices that the ratio between the binder resin and the electroconductive low-melting-point material is set so as to be equal to or more than the so-called percolation threshold (a critical value of a ratio corresponding to the low-melting-point material content at which electroconductivity is exhibited).

As previously described, although the method for forming the first electroconductive layer 71 is not particularly limited, when a printing paste containing a low-melting-point material composed of metal particles is used, a screen printing method is suitable in view of productivity. When a material containing a solvent is used as a printing paste, a drying step for removing the solvent is required. As described previously, the drying temperature in this case is preferably lower than the thermal-fluidization onset temperature $T_1$ of the low-melting-point material. The drying time can be appropriately set at, for example, about 5 minutes to 1 hour.

The first electroconductive layer may be composed of a plurality of layers. The first electroconductive layer may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material.

(Insulating Layer)

In this embodiment, after the formation of the first electroconductive layer 71 is formed on the first principal surface side of the photoelectric conversion section (i.e., on the light-receiving side transparent electrode layer 6a), the insulating layer 9 is formed also on the first electroconductive layer. A material and formation method of the insulating layer 9 is previously described in detail. In this embodiment, the material of the insulating layer 9 is preferably an inorganic material having a low elongation at break, so that a formation of an opening in the insulating layer, which occurs as the surface shape of the first electroconductive layer changes by stress or the like at the interface, in the annealing treatment is facilitated.

The thickness of the insulating layer 9 is preferably so thin that an opening can be formed in the insulating layer by stress or the like at the interface, which occurs as the surface shape of the first electroconductive layer is changed in the annealing treatment. Accordingly, the thickness of the insulating layer 9 is preferably 1000 nm or less, more preferably 500 nm or less. The thickness of the insulating layer on the first electroconductive layer-formed region and the thickness of the insulating layer on the first electroconductive layer-non-formed region may be mutually different. For example, the thickness of the insulating layer may be set so as to facilitate a formation of an opening section in the annealing treatment as to the first electroconductive layer-formed region, and the thickness of the insulating layer may be set so as to have an optical thickness with appropriate antireflection characteristics as to the first electroconductive layer-non-formed region.

In this embodiment, the insulating layer 9 arranged between the first electroconductive layer 71 and the second electroconductive layer 72 can also contribute to improvement of adhesive strength. For example, when a Cu layer is formed on an Ag layer as an under-layer electrode by a plating method, adhesive strength between the Ag layer and the Cu layer is low, but it can be expected that the adhesive strength of the second electroconductive layer is increased to improve the reliability of the solar cell as a result of formation of the Cu layer as the second electroconductive layer on the insulating layer of silicon oxide or the like.

(Formation of Opening)

When the first electroconductive layer 71 includes a low-melting-point material 711, an annealing treatment is performed after the insulating layer is formed on the first electroconductive layer 71 and before the second electroconductive layer 72 is formed. In the annealing treatment, the first electroconductive layer 71 is heated to a temperature higher than the thermal-fluidization onset temperature $T_1$ of the low-melting-point material, and the low-melting-point material is fluidized, so that the surface shape of the first electroconductive layer is changed. In association with this change, the opening 9h is formed in the insulating layer 9 on the first electroconductive layer (FIG. 9 at (E)). Therefore, in the subsequent plating step, a part of the surface of the first electroconductive layer 71 is exposed to a plating solution for conducting electricity, thus making it possible to deposit a metal with the conducting part as the origination point as shown in FIG. 9 at (F).

In this case, the opening is formed principally on the low-melting-point material 711 of the first electroconductive layer 71. When the low-melting-point material is an insulating material, a part immediately below the opening is insulating, but a plating solution is also penetrated into the electroconductive high-melting-point material present on the periphery of the low-melting-point material, and therefore a conductive connection can be established between the first electroconductive layer and the plating solution.

The annealing temperature (heating temperature) Ta in the annealing treatment is preferably higher than the thermal-fluidization onset temperature $T_1$ of the low-melting-point material, i.e., $T_1 < Ta$. The annealing temperature Ta more preferably satisfies $T_1 + 1°$ C.$\leq$Ta$\leq T_1 + 100°$ C., and further preferably satisfies $T_1 + 5°$ C.$\leq$Ta$\leq T_1 + 60°$ C. The annealing temperature can be appropriately set according to the composition and content of the material of the first electroconductive layer, and so on.

The annealing temperature Ta is preferably lower than the heat-resistant temperature of the photoelectric conversion section 50 as described above. The heat-resistant temperature of the photoelectric conversion section varies depending on the configuration of the photoelectric conversion section.

For example, when a transparent electrode layer and an amorphous silicon-based thin-film are provided as in the heterojunction solar cell or the silicon-based thin-film solar cell, the heat-resistant temperature is about 250° C. Thus, in the case of the heterojunction solar cell or a silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower.

In association therewith, the thermal-fluidization onset temperature $T_1$ of the low-melting-point material of the first electroconductive layer 71 is preferably lower than 250° C., more preferably lower than 200° C., further preferably lower than 180° C.

The method for forming the opening 9h in the insulating layer 9 is not limited to the method in which the annealing treatment is performed after formation of the insulating layer. For example, when the insulating layer is formed while the substrate is heated, an opening can be formed almost simultaneously with formation of the insulating layer. Here, the term "almost simultaneously with formation of the insulating layer" means a state in which a step other than the insulating layer forming step, such as an annealing treatment, is not performed. In other words, "almost simultaneously with formation of the insulating layer" means a state during or immediately after formation of the insulating layer. The term "immediately after formation" also includes a duration until the substrate is cooled to room temperature, etc., after formation of the insulating layer is completed (after heating is stopped). Formation of an opening in the insulating layer on the low-melting-point material also includes a situation in which even after formation of the insulating layer on the low-melting-point material is completed, the insulating layer on the periphery of the low-melting-point material is deformed as the insulating layer is formed on the periphery thereof, so that an opening is formed.

As a method for forming an opening almost simultaneously with formation of the insulating layer, for example, a method is used in which the insulating layer 9 is formed on the first electroconductive layer 71 while the substrate is heated to a temperature Tb higher than the thermal-fluidization onset temperature $T_1$ of a low-melting-point material 711 of the first electroconductive layer 71 in the insulating layer forming step. Since the insulating layer 9 is formed on the first electroconductive layer with the low-melting-point material in a fluidized state, stress is generated at a deposition interface concurrently with deposition, so that, opening like a crack, for example, is formed in the insulating layer.

The substrate temperature Tb during formation of the insulating layer (hereinafter, referred to as an "insulating layer formation temperature") refers to a substrate surface temperature at the start of formation of the insulating layer (also referred to as a "substrate heating temperature"). Generally, the mean value of the substrate surface temperature during the formation of the insulating layer is equal to or higher than the substrate surface temperature at the start of deposition. Therefore, when the insulating layer formation temperature Tb is higher than the thermal-fluidization onset temperature $T_1$ of the low-melting-point material, a deformed portion such as an opening can be formed in the insulating layer.

For example, when the insulating layer 9 is formed by a dry method such as a CVD method or a sputtering method, an opening can be formed by ensuring that the substrate surface temperature during formation of the insulating layer is higher than the thermal-fluidization onset temperature $T_1$ of the low-melting-point material. When the insulating layer 9 is formed by a wet method such as coating, an opening can be formed by ensuring that the substrate surface temperature at the time of drying a solvent is higher than the thermal-fluidization onset temperature $T_1$ of the low-melting-point material. The "deposition starting time point" when the insulating layer is formed by a wet method refers to a time point at which drying of a solvent is started. A preferred range of the insulating layer formation temperature Tb is similar to the preferred range of the annealing temperature Ta.

The substrate surface temperature can be measured, for example, with a temperature indication material (so called thermo label or thermo seal) or a thermocouple attached to the substrate surface. The temperature of heating part (e.g., a heater) can be appropriately adjusted so that the surface temperature of the substrate falls within a predetermined range. When an annealing treatment is performed in the insulating layer forming step, an opening can be formed in the insulating layer by appropriately adjusting the material and composition of the insulating layer and deposition conditions (deposition method, substrate temperature, type, and introduction amount of introduced gas, deposition pressure, power density, and the like). When an opening is formed almost simultaneously with formation of the insulating layer and there are locations where formation of the opening is insufficient, etc., the above-described annealing step may be further performed after the formation of the insulating layer.

Explanations have been provided principally for the case of providing the collecting electrode 70 on the light-receiving side of the heterojunction solar cell, but a similar collecting electrode may also be formed on the back side surface. The metal electrode may be formed on the whole of the back surface. In the case where transparent electrode layers (front side transparent electrode layer and back side transparent electrode layer) are deposited to wrap around to the opposite surface on the front side and the back side, respectively, and a metal electrode is formed on the whole of the back surface, the transparent electrode layer on the back side can be protected, for example, by using the back side metal layer as a mask for etching in removal of the front side transparent electrode layer of the outer peripheral portion on the front side. Resultantly, only the transparent electrode layer on the front side can be easily selectively removed.

A solar cell using a crystalline silicon substrate, like the heterojunction solar cell, has a high current value, so that generally the electrical current loss due to contact resistance between the transparent electrode layer and the collecting electrode tends to be remarkable. In contrast, in the present invention, the collecting electrode having the first electroconductive layer and the second electroconductive layer has low contact resistance with the transparent electrode layer, thus making it possible to reduce the electricity generation loss resulting from contact resistance.

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization.

EXAMPLES

The present invention will be more specifically described below by showing preparation examples relating to the heterojunction solar cell shown in FIG. 1, but the present invention is not limited to the Preparation Examples below.

Preparation Example 1

A heterojunction solar cell of Preparation Example 1 was prepared in the following manner.

An n-type single crystal silicon substrate having a light incident surface direction identical to the (100) surface and having a thickness of 200 μm was used as a single crystal silicon substrate of a first conductivity type. The silicon substrate was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the substrate was etched to form a texture. Thereafter, rinse with ultrapure water was performed twice. The surface of the substrate was observed using an atomic force microscope (AFM manufactured by Pacific Nanotechnology, Inc.), and it was confirmed that the surface of the substrate was etched, and a pyramidal texture surface exposed at the (111) plane was formed.

The substrate after etching was introduced into a CVD apparatus, and at the first principal surface (light-receiving surface) side thereof, i-type amorphous silicon was formed with a thickness of 5 nm as an intrinsic silicon-based thin-film $2a$. Conditions for forming the i-type amorphous silicon included a substrate temperature of 150° C., a pressure of 120 Pa, a $SiH_4/H_2$ flow ratio of 3/10, and a power density supply of 0.011 $W/cm^2$. The thickness of the thin-film in this example is a value calculated from a deposition rate determined by measuring the thickness of a thin-film formed on a glass substrate under the same conditions using a spectroscopic ellipsometry (trade name: M2000, manufactured by J. A. Woollam Co. Inc.).

On the i-type amorphous silicon layer $2a$, p-type amorphous silicon was formed with a thickness of 7 nm as a silicon-based thin-film $3a$ of an opposite conductivity type. Conditions for forming the p-type amorphous silicon layer $3a$ included a substrate temperature of 150° C., a pressure of 60 Pa, a $SiH_4/B_2H_6$ flow ratio of 1/3 and a power density supply of 0.01 $W/cm^2$. The $B_2H_6$ gas flow rate mentioned above is a flow rate of a diluting gas wherein $B_2H_6$ concentration was diluted to 5000 ppm using $H_2$ gas.

Thereafter, on the second principal surface (back surface) side of the substrate, an i-type amorphous silicon layer was formed with a thickness of 6 nm as an intrinsic silicon-based thin-film $2b$. Conditions for forming the i-type amorphous silicon layer $2b$ were the same as those for the aforementioned i-type amorphous silicon layer $2a$. On the i-type amorphous silicon layer $2b$, an n-type amorphous silicon layer was formed with a thickness of 4 nm as a silicon-based thin-film $3b$ of the first conductivity type. Conditions for forming the n-type amorphous silicon layer $3b$ included a substrate temperature of 150° C., a pressure of 60 Pa, a $SiH_4/PH_3$ flow ratio of 1/2 and a power density supply of 0.01 $W/cm^2$. The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers $6a$ and $6b$, respectively. The transparent electrode layer was formed by applying a power density of 0.5 $W/cm^2$ in an argon atmosphere at a substrate temperature of room temperature and a pressure of 0.2 Pa using indium oxide as a target. A mask was not used in deposition of the transparent electrode layers, so that each of the transparent electrodes $6a$ and $6b$ was formed to wrap around to the opposite surface to the deposition surface, respectively. On the back side transparent electrode layer $6b$, silver was formed with a thickness of 500 nm as a back side metal electrode $8$ by a sputtering method. A mask was not used also in deposition of the back side metal electrode $8$, so that it was formed to wrap around to the light-receiving side.

A collecting electrode $70$ having a first electroconductive layer $71$ and a second electroconductive layer $72$ was formed on the light-receiving side transparent electrode layer $6a$ in the following manner.

For formation of the first electroconductive layer $71$, a printing paste containing SnBi metal powder (particle size $D_L=25$ to 35 μm; melting point $T_1=141°$ C.) as a low-melting-point material and a silver powder (particle size $D_H=2$ to 3 μm; melting point $T_{2=971}°$ C.) as a high-melting-point material at a weight ratio of 20:80, and further containing an epoxy-based resin as a binder resin was used. The printing paste was screen-printed using a screen plate of #230 mesh (mesh opening: 85 μm) having an opening width (L=80 μm) matching a collecting electrode pattern, and dried at 90° C.

The substrate with the first electroconductive layer $71$ formed thereon was introduced into a CVD apparatus, and a silicon oxide layer (refractive index: 1.5) was formed on the light-receiving side with a thickness of 80 nm as an insulating layer $9$ by a plasma-enhanced CVD method. At this time, the insulating layer was formed on the whole surface of a region other than the outer peripheral portion of the substrate using a mask made of a metal (material: SUS 304, thickness: 0.5 mm) for shielding the outer peripheral portion of the substrate over a width of 2 mm. The insulating layer was formed on the first electroconductive layer as well. Conditions for forming the insulating layer $9$ included a substrate temperature of 135° C., a pressure of 133 Pa, a $SiH_4/CO_2$ flow ratio of 1/20, and a power density supply of 0.05 $W/cm^2$ (frequency 13.56 MHz).

The substrate subjected to formation of the insulating layer on the first principal surface and the preceding steps as described above was immersed in an etchant including hydrochloric acid (concentration: 8%), so that the transparent electrode layer on the outer peripheral portion on the first principal surface side (where the insulating layer was not formed) was etched. Thereafter, washing with pure water was performed to remove impurities such as an etchant remaining on the substrate surface. A visual inspection of the substrate after etching was performed, and resultantly it was found that a transparent electrode layer-non-formed region was formed on the outer peripheral portion on the first principal surface side of the substrate. A transparent electrode layer-transition region was formed between the transparent electrode layer-non-formed region and the transparent electrode layer-mainly-formed region. In observation of a reflected image by an optical microscope, the width of the transparent electrode layer-transition region was found to vary depending on a spot, but fell within a range of about 0.1 to 0.2 mm.

Thereafter, the substrate after formation of the insulating layer was introduced into a circulating hot air oven, and subjected to an annealing treatment at 180° C. for 20 minutes in an air atmosphere. The substrate after the annealing treatment was introduced into a plating tank. For a plating solution, one obtained by adding additives (product numbers: ESY-2B, ESY-H and ESY-1A, manufactured by C.Uyemura & CO., LTD.) to a solution prepared so that the concentrations of copper sulfate pentahydrate, sulfuric acid, and sodium chloride were 120 g/L, 150 g/L, and 70 mg/L, respectively, was used. Using the plating solution, plating was performed under conditions including a temperature of 40° C. and a current density of 3 A/dm$^2$, so that on the insulating layer on the first electroconductive layer 71, copper was uniformly deposited at a thickness of about 10 µm as a second electroconductive layer 72. Little copper was deposited onto a region where no first electroconductive layer was formed.

Preparation Example 2

A heterojunction solar cell was prepared in the same manner as in Preparation Example 1 except that the plating solution was used as the etchant for the transparent electrode layer. A substrate subjected to formation of an insulating layer on a first principal surface and the preceding steps in the same manner as in Preparation Example 1 was not etched with hydrochloric acid, but immersed in a plating solution for forming a second electroconductive layer, and left standing in a plating tank 11 for a certain time to etch the transparent electrode layer. Thereafter, electricity was fed to the first electroconductive layer to perform plating, thereby forming a second electroconductive layer. The heterojunction solar cell in Preparation Example 2 was identical in external appearance to the heterojunction solar cell in Preparation Example 1.

Preparation Example 3

A heterojunction solar cell was prepared in the same manner as in Preparation Example 1 except that in formation of an insulating layer, a mask made of a metal (material: SUS 304; thickness: 0.2 mm) was used to shield the outer peripheral portion of a substrate over a width of 1 mm. The heterojunction solar cell in Preparation Example 3 was identical in external appearance to the heterojunction solar cell in Preparation Example 1 except that the width of the transparent electrode layer-non-formed region was smaller as compared to the heterojunction solar cell in Preparation Example 1.

Preparation Example 4

In Preparation Example 4, a solar cell was prepared through the steps shown in FIG. 8. After formation of the transparent electrode layer 6a, the Cu seed layer 78 was formed thereon in a thickness of 100 nm using a sputtering method. During formation of the Cu seed layer, a mask was not used, and the Cu seed layer was deposited to wrap around to the back side similarly to the light-receiving side transparent electrode layer 6a.

A photoresist was printed on the Cu seed layer in a thickness of 15 µm. At this time, pattern printing was performed by screen printing in such a manner that a resist was not formed on a region of 0.4 mm from the outer peripheral end of the substrate.

The substrate subjected to formation of the insulating layer (resist layer) on the first principal surface and the preceding steps as described above was immersed in 10 wt % of nitric acid aqueous solution, so that the Cu seed layer and the transparent electrode layer on the outer peripheral portion on the first principal surface side (where the insulating layer was not formed) were etched. Thereafter, washing with pure water was performed to remove impurities such as an etchant remaining on the substrate surface. A visual inspection of the substrate after etching was performed, and resultantly it was found that, on the first principal surface side of the substrate, the Cu seed layer and the transparent electrode layer are removed and a transparent electrode layer-non-formed region was formed on the outer peripheral portion. A reflected image of the substrate with an optical microscope is shown in FIGS. 10(A) and (B). FIG. 10(B) shows an observation image of the framed section in FIG. 10(A) at a high magnification. The width of the electrode layer-transition region was found to vary depending on location, but fell within a range of about 0.01 to 0.02 mm.

After the Cu seed layer and the transparent electrode layer on the outer peripheral portion were removed, a photomask was placed on the resist layer, exposure and development were performed, and the resist on the collecting electrode-formed region was removed. Thereafter, in the opening section of the insulating layer on the Cu seed layer, copper was uniformly deposited as the second electroconductive layer 72 in a thickness of about 10 µm by electroplating similarly to Preparation Example 1.

Thereafter, the resist was peeled off, and further, an etchant (seed layer removing solution) was used to remove the Cu seed layer exposed to the second electroconductive layer-non-formed region, thereby patterning the Cu seed layer (first electroconductive layer).

Preparation Example 5

A transparent electrode layer and an insulating layer were formed on the whole of a first principal surface of a photoelectric conversion section without using a mask during formation of the transparent electrode layer and the insulating layer. Similarly to Preparation Example 2, the substrate was left standing in the plating tank 11 before electricity was fed for plating, but the insulating layer was formed on the whole surface of the transparent electrode layer, and therefore the transparent electrode layer was not etched. In Preparation Example 5, both the transparent electrode layer and the insulating layer were deposited to wrap around to the back side, and the whole surface of the transparent electrode layer was covered with the insulating layer, so that a transparent electrode layer-non-formed region was not formed. There was no transition region between the transparent electrode layer-mainly-formed region and the transparent electrode layer-non-formed region. Therefore, after a plating step for removing a short-circuited portion, a groove was formed by applying laser light from the back side to a position of 1 to 2 mm from the end portion of the cell in a laser processing apparatus, and the substrate was cleaved with the groove as an origination point to remove the substrate on the peripheral portion of the cell over a width of 1 to 2 mm. Otherwise in the same manner as in Preparation Example 1, a heterojunction solar cell was prepared.

Preparation Example 6

In formation of a transparent electrode layer, deposition was performed using a mask having a shape identical to the mask used during formation of the insulating layer in Preparation Example 1 to shield the outer peripheral portion of a substrate over a width of 2 mm. An insulating layer was formed on the whole surface without using a mask. Since the transparent electrode layer was formed using a mask, a transparent electrode layer-non-formed region was formed on the outer peripheral portion. On the other hand, the insulating layer was formed to wrap around to the back side. Similarly to Preparation Example 2, the substrate was left standing in the plating tank 11 before electricity was fed for plating, but the insulating layer was formed on the whole surface of the transparent electrode layer, and therefore the transparent electrode layer was not etched.

A reflected image of the substrate with an optical microscope before performing plating is shown in FIG. 11. In FIG. 11, the region of about 100 μm from the left end in the figure is the electrode layer-non-formed region 265, the region of about 200 μm from the right end in the figure is the electrode layer-mainly-formed region 261, and the region between these regions is the electrode layer-transition region 263. It is apparent that in Preparation Example 6, since a mask was used during formation of the transparent electrode layer, a transparent electrode layer-transition region having a width of about 0.6 to 1 mm was formed during the deposition with a mask.

Preparation Example 7

A heterojunction solar cell was prepared in the same manner as in Preparation Example 1 except that in deposition of a transparent electrode layer, a mask with a design identical to the mask used in deposition of the insulating layer in Preparation Example 1 was used to shield the outer peripheral portion of a substrate over a width of 2 mm (similar to Preparation Example 6), and the transparent electrode layer was etched in the plating step.

Preparation Example 8

A heterojunction solar cell was prepared in the same manner as in Preparation Example 6 except that in deposition of a transparent electrode layer, a mask made of a metal (material: SUS 304; thickness: 0.5 mm) was used to shield the outer peripheral portion of a substrate over a width of 1 mm.

Preparation Example 9

Formation of a first electroconductive layer, formation of an insulating layer, etching of an outer peripheral portion, and formation of openings in the insulating layer by an annealing treatment were performed in the same manner as in Preparation Example 1, but no second electroconductive layer was formed. In other words, in Preparation Example 9, a collecting electrode was formed from a single layer of an electroconductive paste.

Preparation conditions, results of visual inspection, and results of measurements of solar cell characteristics (open circuit voltage (Voc), short circuit current (Isc), fill factor (FF), and maximum power (Pmax)) for the heterojunction solar cells of the above described examples and comparative examples are shown in Table 1. Solar cell characteristics are shown as a ratio (relative value) with the evaluation result in Preparation Example 1 set to 1.

TABLE 1

| | manufacturing conditions | | | | | | solar cell characteristics (relative value) | | | |
|---|---|---|---|---|---|---|---|---|---|---|
| | collecting electrode composition | transparent electrode layer deposition | insulating layer deposition | etching treatment | laser processing | transparent electrode layer-transition region width | Voc | Isc | F.F | Pmax |
| Preparation Example 1 | two layers (Ag/Cu plating) | whole surface deposition | mask deposition (shielding width 2 mm) | — | — | 0.1-0.2 mm | 1 | 1 | 1 | 1 |
| Preparation Example 2 | two layers (Ag/Cu plating) | whole surface deposition | mask deposition (shielding width 2 mm) | plating solution | — | 0.1-0.2 mm | 1.00 | 1.00 | 1.00 | 1.00 |
| Preparation Example 3 | two layers (Ag/Cu plating) | whole surface deposition | mask deposition (shielding width 1 mm) | hydro-chloric acid | — | 0.1-0.2 mm | 1.00 | 1.01 | 1.00 | 1.01 |
| Preparation Example 4 | two layers (Ag/Cu plating) | whole surface deposition | pattern printing (shielding width 0.4 mm) | hydro-chloric acid | — | 0.01-0.02 mm | 1.00 | 1.01 | 1.00 | 1.01 |
| Preparation Example 5 | two layers (Ag/Cu plating) | whole surface deposition | whole surface deposition | — | removal of 1~2 mm width | ~0 mm | 1.00 | 0.98 | 1.00 | 0.99 |
| Preparation Example 6 | two layers (Ag/Cu plating) | mask deposition (shielding width 2 mm) | whole surface deposition | — | — | 0.6-1 mm | 1.00 | 1.00 | 0.99 | 0.99 |
| Preparation Example 7 | two layers (Ag/Cu plating) | mask deposition (shielding width 2 mm) | mask deposition (shielding width 2 mm) | — | — | 0.6-1 mm | 1.00 | 1.00 | 0.98 | 0.98 |
| Preparation Example 8 | two layers (Ag/Cu plating) | mask deposition (shielding width 1 mm) | whole surface deposition | — | — | 0.6-1 mm | 1.00 | 1.00 | 0.96 | 0.96 |
| Preparation Example 9 | single layer (ag paste) | whole surface deposition | mask deposition (shielding width 2 mm) | hydro-chloric acid | — | 0.1-0.2 mm | 1.00 | 1.00 | 0.95 | 0.95 |

In Preparation Examples 1 to 7 where the collecting electrode included two layers, the first electroconductive layer (Ag paste layer) and the second electroconductive layer (Cu plating layer), the fill factor (FF) was higher than that in Preparation Example 9 where the collecting electrode included only an Ag paste layer. This is considered to be because a current loss caused by resistance was reduced by forming a Cu plating layer as the second electroconductive layer.

Comparison between Preparation Examples 1 to 3 where a short circuit between the front and the back surfaces was eliminated by etching the transparent electrode layer on the outer peripheral portion and Preparation Example 5 where a short circuit between the front and the back surfaces was eliminated by cleaving the crystalline silicon substrate shows that Preparation Examples 1 to 3 had a higher short circuit current (Isc). In Preparation Example 5, the area of the solar cell (semiconductor-stacked portion) decreased because the outer peripheral portion of the substrate was cleaved and removed, whereas in Preparation Examples 1 to 3, the area of the semiconductor-stacked portion did not decrease because only the outer peripheral portion of the transparent electrode layer was removed by etching, and therefore the effective power generation region was kept large, so that a high short circuit current (Isc) could be achieved.

Preparation Examples 6 to 8 where the transparent electrode layer was formed while the outer peripheral portion of the substrate was covered with a mask were comparable in the area of the semiconductor-stacked portion to Preparation Examples 1 to 4, and therefore comparable in short circuit current (Isc) to Preparation Examples 1 to 4. On the other hand, Preparation Examples 6 to 8 each had a lower fill factor (FF) as compared to Preparation Examples 1 to 4. When the mask was disposed so as to come into close contact with the silicon-based thin-film on the substrate during deposition of the transparent electrode layer, physical damages occurred in the silicon-based thin-film, so that film quality of the silicon-based thin-film on the peripheral portion of the substrate was deteriorated. This may be one of the causes of the decrease in fill factor (FF). In Preparation Examples 6 to 8, the transparent electrode layer was formed using a mask, and therefore the transparent electrode layer-transition region had a large width of 0.6 to 1 mm, so that the resistance in the transparent electrode layer-transition region increased. This may also be a cause of the decrease in fill factor (FF).

Preparation Example 8 where the shielding width with a mask during deposition of the transparent electrode layer was 1 mm had a lower fill factor (FF) as compared to Preparation Example 6 where the shielding width was 2 mm. The result of the visual inspection shows that in Preparation Example 6, a transparent electrode layer-non-formed region was formed. On the other hand, the electrical characteristics of the solar cell were evaluated, and resultantly it was found that the front and the back surfaces were in conduction with each other, and a short circuit occurred. It is considered that during deposition of the transparent electrode layer, the transparent electrode layer was deposited so as to penetrate below the mask, etc., so that a transparent electrode layer-transition region was formed, and short circuit spots, which are hardly confirmed by a visual inspection, generated between electrode layers on the light-receiving side and the back side through the transparent electrode layer-transition region.

On the other hand, in Preparation Examples 1 to 4, the transparent electrode layer (and metal layer) exposed to the insulating layer-non-formed region (a region covered with a mask during formation of the insulating layer, or a non-printed region) was etched to form the transparent electrode layer-non-formed region, and therefore the width of the transparent electrode layer-transition region could be made as small as about 0.1 to 0.2 mm. It is considered that the fill factor (FF) was therefore improved as compared to Preparation Examples 6 to 8.

Preparation Example 1 and Preparation Example 2 used different kinds of etchants for etching the transparent electrode layer, but exhibited comparable solar cell characteristics. From this, it is apparent that when the outer peripheral portion of the transparent electrode layer is removed by etching in a plating tank using a plating solution for forming the second electroconductive layer by a plating method as in Preparation Example 2, necessity to additionally perform an etching step and a washing step is eliminated, so that productivity can be improved while high solar cell characteristics are maintained.

In Preparation Example 3 and Preparation Example 4, the insulating layer-formed region was larger (the insulating layer-non-formed region was smaller) as compared to Preparation Example 1, and the transparent electrode layer-formed region accordingly became larger. Thus, it is considered that in Preparation Example 3 and Preparation Example 4, carriers in the vicinity of the outer periphery of the photoelectric conversion section can be more efficiently collected, so that the short circuit current (Isc) increases as compared to Preparation Example 1.

The shielding width (1 mm) with a mask during deposition of the insulating layer in Preparation Example 3 was identical to the shielding width with a mask during deposition of the transparent electrode layer in Preparation Example 8, but in Preparation Example 3, a decrease in fill factor (FF) as in Preparation Example 8 was not confirmed. From this result, the method in which the transparent electrode layer exposed to the insulating layer-non-formed region is removed by etching makes it possible to make the transparent electrode layer-non-formed region and the transparent electrode layer-transition region smaller as compared to a case where the transparent electrode layer is formed using a mask, so that a solar cell having a large effective area and excellent conversion efficiency can be obtained.

DESCRIPTION OF REFERENCE CHARACTERS 1 crystalline silicon substrate
2a, 2b intrinsic silicon-based thin-film
3a, 3b conductive silicon-based thin-film
6a, 6b transparent electrode layer
61 transparent electrode layer-mainly-formed region
63 transparent electrode layer-transition region
65 transparent electrode layer-non-formed region
70 collecting electrode
71 first electroconductive layer
711 low-melting-point material
72 second electroconductive layer
8 back side metal electrode
9 insulating layer
9h opening
50 photoelectric conversion section
101 heterojunction solar cell
10 plating apparatus
11 plating tank
12 substrate
13 anode
14 substrate holder
15 power source
16 plating solution

The invention claimed is:
1. A manufacturing method of a solar cell, the solar cell comprising: a photoelectric conversion section having a first principal surface and a second principal surface; and a collecting electrode formed on the first principal surface of the photoelectric conversion section,
the photoelectric conversion section includes a semiconductor-stacked portion including a semiconductor junction, a first electrode layer formed on the first principal surface side of the semiconductor-stacked portion, and a second electrode layer formed on the second principal surface side of the semiconductor-stacked portion,
the first electrode layer is a transparent electrode layer and the second electrode layer includes a transparent electrode layer,
the collecting electrode includes a first electroconductive layer and a second electroconductive layer in this order from the first principal surface side of the photoelectric conversion section,
wherein the method comprises:
a photoelectric conversion section providing step of forming the first electrode layer and the second electrode layer, respectively, on the first principal surface and the second principal surface on the semiconductor-stacked portion;
a first electroconductive layer forming step of forming the first electroconductive layer on the first electrode layer;
an insulating layer forming step of forming an insulating layer on the first electrode layer; and
a second electroconductive layer forming step of forming the second electroconductive layer on the first electroconductive layer by a plating method, wherein
in the photoelectric conversion section providing step, a state in which the first electrode layer and the second electrode layer are short-circuited is created by forming the first electrode layer and the second electrode layer without using a mask,
in the insulating layer forming step, the insulating layer is not formed on an outer peripheral portion of the first principal surface, and the first electrode layer is exposed to a surface in an insulating layer-non-formed region on the outer peripheral portion of the first principal surface; and
after the insulating layer forming step, a short circuit eliminating step of removing the first electrode layer exposed to the surface of the insulating layer-non-formed region is performed by wet etching while the insulating layer is used as an etching mask, thereby the short circuit between the first electrode layer and the second electrode layer is eliminated.
2. The manufacturing method of a solar cell according to claim 1, wherein
in the short circuit eliminating step, the first electrode layer exposed to the surface of the insulating layer-non-formed region is removed by using the same kind of chemical solution as a plating solution used for the second electroconductive layer forming step.
3. The manufacturing method of a solar cell according to claim 1, wherein
the short circuit eliminating step is performed by removing the first electrode layer exposed to the surface of the insulating layer-non-formed region using a plating solution that is used for formation of the second electroconductive layer in a plating apparatus for forming the second electroconductive layer.
4. The manufacturing method of a solar cell according to claim 1, wherein in the insulating layer forming step, the insulating layer is also formed on the first electroconductive layer, and
in the second electroconductive layer forming step, the second electroconductive layer being in conduction with the first electroconductive layer through an opening provided in the insulating layer on the first electroconductive layer is formed by the plating method.
5. The manufacturing method of a solar cell according to claim 4, wherein
the first electroconductive layer contains a low-melting-point material,
after the insulating layer forming step and before the second electroconductive layer forming step, a heating treatment is performed at an annealing temperature Ta which is higher than a thermal-fluidization onset temperature $T_1$ of the low-melting-point material, thereby the opening is formed in the insulating layer.
6. The manufacturing method of a solar cell according to claim 1, wherein
by removing the first electrode layer exposed to the insulating layer-non-formed region in the short circuit eliminating step, a first electrode layer-transition region where at least one of a coverage and a thickness of the first electrode layer is smaller as compared to other first electrode layer-formed regions is formed on the outer peripheral portion of the first electrode layer, and
the first electrode layer-transition region has a width of 0.001 mm or more and 0.5 mm or less.
7. The manufacturing method of a solar cell according to claim 1, wherein
in the second electroconductive layer forming step, the second electroconductive layer including copper as a main component is formed by the plating method.
8. The manufacturing method of a solar cell according to claim 1, wherein
the semiconductor-stacked portion of the photoelectric conversion section includes a silicon-based thin-film on a first principal surface of a crystalline silicon substrate, and on a second principal surface of the crystalline silicon substrate, a silicon-based thin-film having a conductivity-type different from that of the silicon-based thin-film on the first principal surface.
9. A manufacturing method of a crystal silicon-based solar cell module, comprising:
a step of manufacturing a crystal silicon-based solar cell by a method according to claim 1; and
a step of sealing the solar cell, in this order.
10. A manufacturing method of a solar cell, the solar cell comprising: a photoelectric conversion section having a first principal surface and a second principal surface; and a collecting electrode formed on the first principal surface of the photoelectric conversion section,
the photoelectric conversion section includes a semiconductor-stacked portion including a semiconductor junction, a first electrode layer formed on the first principal surface side of the semiconductor-stacked portion, and a second electrode layer formed on the second principal surface side of the semiconductor-stacked portion,
the first electrode layer is a transparent electrode layer and the second electrode layer includes a metal electrode layer,
the collecting electrode includes a first electroconductive layer and a second electroconductive layer in this order from the first principal surface side of the photoelectric conversion section, the method comprises:
a photoelectric conversion section providing step of forming the first electrode layer and the second electrode layer, respectively, on the first principal surface and the second principal surface on the semiconductor-stacked portion;
a first electroconductive layer forming step of forming the first electroconductive layer on the first electrode layer;
an insulating layer forming step of forming an insulating layer on the first electrode layer; and
a second electroconductive layer forming step of forming the second electroconductive layer on the first electroconductive layer by a plating method, wherein
in the photoelectric conversion section providing step, a state in which the first electrode layer and the second electrode layer are short-circuited is created by forming the first electrode layer and the second electrode layer without using a mask,
in the insulating layer forming step, the insulating layer is not formed on an outer peripheral portion of the first principal surface, and the first electrode layer is exposed to a surface in an insulating layer-non-formed region on the outer peripheral portion of the first principal surface; and
after the insulating layer forming step, a short circuit eliminating step of removing the first electrode layer exposed to the surface of the insulating layer-non-formed region is performed by wet etching while the insulating layer and the metal electrode layer of the second electrode layer are used as an etching mask, thereby the short circuit between the first electrode layer and the second electrode layer is eliminated.

11. The manufacturing method of a solar cell according to claim 10, wherein
in the short circuit eliminating step, the first electrode layer exposed to the surface of the insulating layer-non-formed region is removed by using the same kind of chemical solution as a plating solution used for the second electroconductive layer forming step.

12. The manufacturing method of a solar cell according to claim 10, wherein
the short circuit eliminating step is performed by removing the first electrode layer exposed to the surface of the insulating layer-non-formed region using a plating solution that is used for formation of the second electroconductive layer in a plating apparatus for forming the second electroconductive layer.

13. The manufacturing method of a solar cell according to claim 10, wherein in the insulating layer forming step, the insulating layer is also formed on the first electroconductive layer, and
in the second electroconductive layer forming step, the second electroconductive layer being in conduction with the first electroconductive layer through an opening provided in the insulating layer on the first electroconductive layer is formed by the plating method.

14. The manufacturing method of a solar cell according to claim 13, wherein
the first electroconductive layer contains a low-melting-point material,
after the insulating layer forming step and before the second electroconductive layer forming step, a heating treatment is performed at an annealing temperature Ta which is higher than a thermal-fluidization onset temperature $T_1$ of the low-melting-point material, thereby the opening is formed in the insulating layer.

15. The manufacturing method of a solar cell according to claim 10, wherein
by removing the first electrode layer exposed to the insulating layer-non-formed region in the short circuit eliminating step, a first electrode layer-transition region where at least one of a coverage and a thickness of the first electrode layer is smaller as compared to other first electrode layer-formed regions is formed on the outer peripheral portion of the first electrode layer, and
the first electrode layer-transition region has a width of 0.001 mm or more and 0.5 mm or less.

16. The manufacturing method of a solar cell according to claim 10, wherein
in the second electroconductive layer forming step, the second electroconductive layer including copper as a main component is formed by the plating method.

17. The manufacturing method of a solar cell according to claim 10, wherein
the semiconductor-stacked portion of the photoelectric conversion section includes a silicon-based thin-film on a first principal surface of a crystalline silicon substrate, and on a second principal surface of the crystalline silicon substrate of a first conductivity type, a silicon-based thin-film having a conductivity-type different from that of the silicon-based thin-film on the first principal surface.

18. A manufacturing method of a crystal silicon-based solar cell module, comprising:
a step of manufacturing a crystal silicon-based solar cell by a method according to claim 10; and
a step of sealing the solar cell, in this order.

* * * * *